(12) United States Patent
Donzier et al.

(10) Patent No.: US 10,472,951 B2
(45) Date of Patent: Nov. 12, 2019

(54) DOWNHOLE ACOUSTIC TRANSDUCER, DOWNHOLE PROBE AND TOOL COMPRISING SUCH A TRANSDUCER

(71) Applicant: OPENFIELD, Versailles (FR)

(72) Inventors: Eric Donzier, Bercheres sur Vesgre (FR); Linda Abbassi, Montigny le Bretonneux (FR); Emmanuel Tavernier, Paris (FR)

(73) Assignee: OPENFIELD, Versailles (FR)

( * ) Notice: Subject to any disclaimer, the term of this patent is extended or adjusted under 35 U.S.C. 154(b) by 379 days.

(21) Appl. No.: 15/208,480

(22) Filed: Jul. 12, 2016

(65) Prior Publication Data

US 2017/0016316 A1 Jan. 19, 2017

(30) Foreign Application Priority Data

Jul. 13, 2015 (EP) .................................. 15176417

(51) Int. Cl.
*E21B 47/08* (2012.01)
*E21B 17/10* (2006.01)
*G06F 17/50* (2006.01)

(52) U.S. Cl.
CPC ........ *E21B 47/082* (2013.01); *E21B 17/1078* (2013.01); *G06F 17/5009* (2013.01)

(58) Field of Classification Search
None
See application file for complete search history.

(56) References Cited

U.S. PATENT DOCUMENTS 2,496,293 A 2/1950 Kiernan
4,030,175 A 6/1977 McShane
(Continued)

FOREIGN PATENT DOCUMENTS

DE 9406896 U1 6/1994
GB 1290236 A 9/1972
(Continued)

OTHER PUBLICATIONS

EP15176417 European Search Report, dated Jan. 15, 2015, The Hague, Germany.

*Primary Examiner* — Paul M. West
*Assistant Examiner* — Mark A Shabman
(74) *Attorney, Agent, or Firm* — Pehr B. Jansson; The Jansson Firm

(57) ABSTRACT

A downhole ultrasonic transducer (10) used to transmit and/or receive ultrasonic waves in a hydrocarbon well where a fluid is present comprises:
a metal housing (11) defining an internal cavity (12) isolated from the fluid of the hydrocarbon well (100) by a membrane wall (13) made of metal or metal alloy;
a piezoelectric element (14) mounted inside the internal cavity (12), the piezoelectric element (14) having a front side (20) mechanically coupled on the membrane wall (13);
wherein:
the internal cavity (12) is at a pressure unrelated to a hydrocarbon well pressure;
a back side (21) of the piezoelectric element (14) is arranged to be free to oscillate in the internal cavity (12) so as to generate a high acoustic impedance mismatch between the piezoelectric element (14) and the internal cavity (12) at the back side (21) and to maximize acoustic transmission at the front side (20); and
a thickness (ei) of the membrane wall (13) is such that there is a common resonance between the membrane wall and the piezoelectric element thereby achieving high acoustic transmission through the membrane wall (13), and such that the membrane wall (13) is suitable to resist to the hydrocarbon well pressure.

14 Claims, 15 Drawing Sheets

(56) References Cited

U.S. PATENT DOCUMENTS

| | | | |
|---|---|---|---|
| 4,492,865 A * | 1/1985 | Murphy | E21B 21/08 |
| | | | 250/254 |
| 4,947,683 A | 8/1990 | Minear | |
| 5,631,413 A | 5/1997 | Young | |
| 6,058,786 A * | 5/2000 | Wallen | A61B 5/087 |
| | | | 73/861.28 |
| 6,354,146 B1 | 3/2002 | Birchak et al. | |
| 6,895,825 B1 * | 5/2005 | Barkhoudarian | G01F 1/662 |
| | | | 73/861.28 |
| 8,117,907 B2 * | 2/2012 | Han | E21B 47/082 |
| | | | 73/152.58 |
| 8,783,099 B2 * | 7/2014 | Lilly | E21B 47/011 |
| | | | 73/152.51 |
| 2005/0000279 A1 * | 1/2005 | Yogeswaren | B06B 1/0622 |
| | | | 73/152.58 |
| 2007/0084277 A1 * | 4/2007 | Steinsiek | E21B 47/101 |
| | | | 73/152.18 |
| 2011/0004123 A1 * | 1/2011 | Companion | A61B 5/204 |
| | | | 600/587 |
| 2012/0163126 A1 * | 6/2012 | Campbell | B06B 1/0614 |
| | | | 367/135 |

FOREIGN PATENT DOCUMENTS

| | | |
|---|---|---|
| JP | S51128615 A | 11/1976 |
| SU | 603933 A1 | 4/1978 |

* cited by examiner

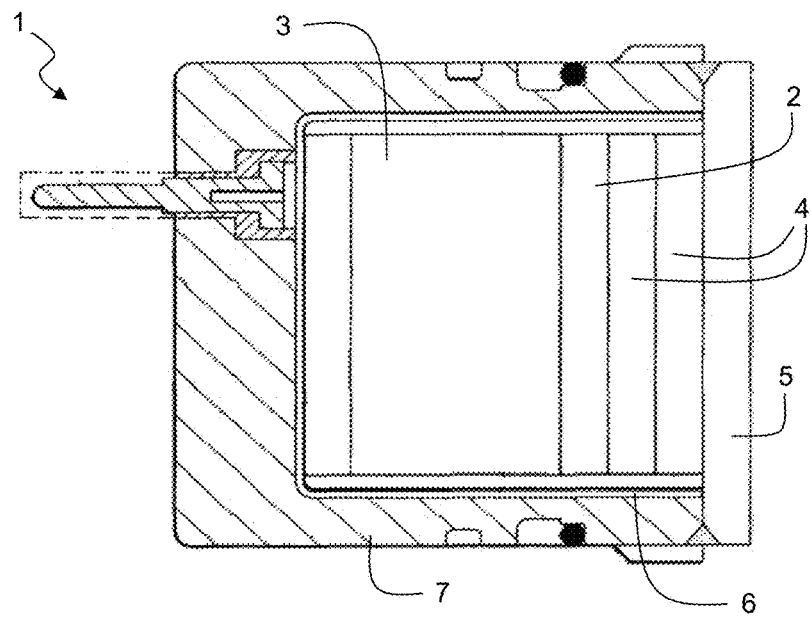
FIG. 1A – PRIOR ART
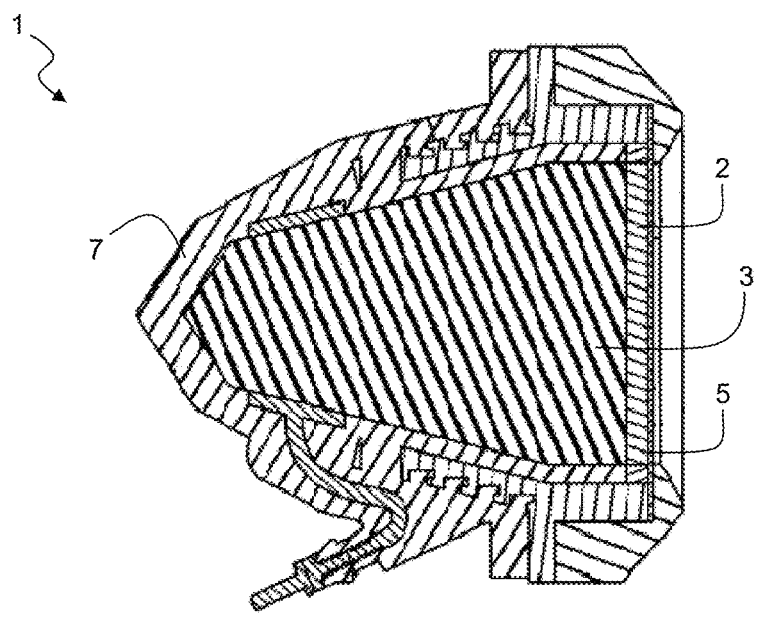
FIG. 1B – PRIOR ART

DOWNHOLE ACOUSTIC TRANSDUCER, DOWNHOLE PROBE AND TOOL COMPRISING SUCH A TRANSDUCER

TECHNICAL FIELD

The invention relates to a downhole ultrasonic transducer, a downhole probe and a downhole tool comprising such a downhole ultrasonic transducer. The invention is particularly applicable to the performance of acoustic measurements at downhole pressure and temperature conditions. These measurements may be related to a borehole of a hydrocarbon well drilled into a subterranean formation (e.g. contactless caliper for measurement of the borehole diameter, borehole shape, casing corrosion, etc. . . . ), or to fluid flowing into such borehole (e.g. mud used in drilling operations, multiphase fluid mixtures flowing from a hydrocarbon bearing zone, etc. . . . ). The invention is particularly applicable in harsh downhole environment including high temperature (up to 200° C.), high pressure (up to 2.000 bars) and corrosive fluid.

BACKGROUND

Ultrasonic transducer design is complex because material properties, structures geometries, assembly processes, as well as electrical connections, analog electronics front ends and digital computation algorithms have to be optimized in order to fit the specific requirements of the applications. In particular the size, electro-acoustic transmission and reception efficiency, operating frequency and bandwidth of the ultrasonic transducer are parameters of great importance depending on the ultrasonic transducer application. As an example, for imaging applications, spatial resolution is of prime importance. This leads to the selections of small size focused high frequency ultrasonic transducers with high damping in order to optimize spatial resolution both in lateral and depth scanning. For that reason ultrasonic transducer performance is a notion relative to the application fields. This is especially true for measurements in harsh downhole environments such as downhole oil and gas wells where equipments are required to operate under high temperature, high pressure, high shocks and vibrations and are submitted to corrosive fluids.

A typical ultrasonic transducer has a layer structure comprising a piezoelectric element, a backing part at a back side of the piezoelectric element and an impedance matching part at a front side of the piezoelectric element. The backing part is generally made of metal particles filled rubber that provides optimal damping and acoustic impedance characteristics, as well as electrical connection for the ultrasonic transducer. Such an ultrasonic transducer cannot be used in downhole environment where high pressure, high temperature and mechanical shocks would induce stresses resulting in damages to the piezoelectric element.

The oilfield industry has developed specific ultrasonic transducers allowing operation at high pressure, high temperature and protecting the ultrasonic transducers against conductive and corrosive fluids.

According to a first solution, the typical ultrasonic transducer hereinbefore described is positioned inside a compensated pressure chamber filled with a liquid (e.g. oil). The document U.S. Pat. No. 7,513,147 (FIG. 1A) describes an acoustic sensor 1 for use in a downhole measurement tool including a piezo-composite transducer element 2. In various exemplary embodiments, the acoustic sensor further includes a composite backing layer 3, at least one matching layer 4, and a barrier layer 5 deployed at an outermost surface of the sensor. The sensor comprises an annular region including a pressure equalization layer 6 disposed inside the housing 7 and around the sensor components. The pressure equalization layer 6 is a thin layer of silicone oil and functions to evenly distribute borehole pressure changes about the sensor components. Exemplary embodiments of this invention may withstand the extreme temperatures, pressures, and mechanical shocks frequent in downhole environments and thus may exhibit improved robustness. Also, the document US 2007/084277 describes an ultrasonic sensor placed in a wellbore having a resonant member that is exposed to a fluid in the wellbore. At a location in the wellbore, acoustic energy is measured wherein the acoustic energy is related to turbulence from formation fluid entering the wellbore. The ultrasonic sensor generates electrical signals when exposed to ultrasonic turbulences caused by a formation fluid entering into the wellbore. A processor processes the electrical signals to detect the flow of the formation fluid entering into the wellbore. Such an ultrasonic sensor comprises a pressure compensation arrangement to compensate for the pressure variations in the wellbore.

According to a second solution, the typical ultrasonic transducer 1 hereinbefore described further comprises elements made of flexible materials that absorb displacements induced by high pressure and high temperature. The document EP 2 610 432 (FIG. 1B) describes an ultrasonic transducer for use in a downhole measurement tool. The ultrasonic transducer 1 includes a piezoelectric element 2 coupled to a backing 3, and enclosed within a compliant material housing 7. The compliant material housing 7 may be flexible for withstanding extreme temperatures, pressures, and mechanical shocks that may be present in downhole environments.

The drawbacks of such conventional solutions are their complex design using expensive and large mechanical pieces, hermetic electrical feedthrough to connect the transducer to electronic circuits which are positioned in part of the tool at atmospheric pressure, external membrane (e.g. of fluoroelastomer) to protect the piezo element against corrosive and conductive fluids, or complex pressure compensation arrangement to compensate for the pressure variations in the wellbore.

SUMMARY OF THE DISCLOSURE

It is an object of the invention to propose a downhole ultrasonic transducer that overcomes one or more of the limitations or drawbacks of the existing downhole ultrasonic transducers.

According to one aspect, there is provided a downhole ultrasonic transducer used to transmit and/or receive ultrasonic waves in a hydrocarbon well where a fluid is present comprising:

a metal housing defining an internal cavity isolated from the fluid of the hydrocarbon well by a membrane wall made of metal or metal alloy;

a piezoelectric element mounted inside the internal cavity, the piezoelectric element having a front side mechanically coupled on the membrane wall;

wherein:

the internal cavity (12) is at a pressure unrelated to a downhole hydrocarbon well pressure;

a back side of the piezoelectric element is arranged to be free to oscillate in the internal cavity so as to generate a high acoustic impedance mismatch between the piezoelectric element and the internal cavity at the back side and to maximize acoustic transmission at the front side; and a thickness of the membrane wall is such that there is a common resonance between the membrane wall and the piezoelectric element thereby achieving high acoustic transmission through the membrane wall, and such that the membrane wall is suitable to resist to the downhole hydrocarbon well pressure.

The thickness of the membrane wall may be selected from the group comprising thicknesses corresponding to bands of high acoustic power emission/reception efficiency, thicknesses corresponding to bands of low sensitivity to thickness variation, thicknesses corresponding to bands of large peak frequency bandwidth, and thicknesses corresponding to bands of high order modes of resonance of the piezoelectric element, and wherein such bands corresponds to a maximum acoustic transmission and high pressure operation using a predetermined mathematical model.

The thickness of the membrane wall may be an integer multiple of a half wavelength of the ultrasonic waves generated or received by the piezoelectric element and travelling inside the membrane wall.

The internal cavity may be under a pressure ranging from 0 to 4 atm.

The piezoelectric element may have a disk shape, and the housing, internal cavity and membrane wall may have a cylindrical shape.

The piezoelectric element may be made of a piezoelectric ceramic.

At least the membrane wall may be made of austenite nickel-chromium-based super-alloys commercialized under the trademark Inconel.

The piezoelectric element may comprise metallization layers on the front and back sides.

The piezoelectric element may be coupled to the membrane wall by a coupling means chosen in the group comprising conductive glue, brazing, silver glass frit or eutectic bonding.

The back side of the piezoelectric element may be connected to a control circuit by wire bonding, and the front side of the piezoelectric element coupled to the membrane wall of the metal housing may be connected to the ground.

The downhole ultrasonic transducer may further comprise a projecting element directing emission of the piezoelectric element towards an inclined direction.

According to a further aspect, there is provided a downhole ultrasonic probe comprising a single downhole ultrasonic transducer of the invention, wherein said downhole ultrasonic transducer is positioned at a tip of an elongated and flexible protective tube.

According to still a further aspect, there is provided a downhole ultrasonic probe comprising multiple downhole ultrasonic transducers of the invention, wherein said downhole ultrasonic transducers are angularly distributed as an array around a cylindrical housing, each downhole ultrasonic transducer defining a measuring angular sector around the probe, each downhole ultrasonic transducer being connected to a tool control circuit, the tool housing constituting a ground for the tool control circuit.

According to still a further aspect, there is provided a downhole logging tool adapted for displacement along and within a bore hole of a hydrocarbon well comprising a centralizer, comprising at least one downhole ultrasonic probe of the invention, the elongated and flexible protective tube being mounted on at least one deploying arm of the centralizer such as to follow movements of the centralizer.

According to still a further aspect, there is provided a downhole logging tool adapted for displacement along and within a bore hole of a hydrocarbon well, comprising at least one downhole ultrasonic probe of the invention disposed in between sub sections of the downhole tool.

According to still a further aspect, there is provided a downhole drill stem testing tool comprising a downhole pipe defining an internal tubing for letting flow a fluid mixture and at least one downhole ultrasonic transducer of the invention wherein the projecting element projects into the internal tubing such as to transmit and/or receive ultrasonic waves directed according to an inclined direction with respect to a longitudinal axis of the downhole pipe.

Thus, the downhole ultrasonic transducer of the invention has not any backing element, not any pressure compensation system and not any mechanical shock absorption system.

With the invention, it is possible to operate the downhole ultrasonic transducer under extreme pressures, temperatures, shocks and corrosive environments while keeping excellent sensitivity performance. The invention enables the miniaturization of the downhole ultrasonic transducer authorizing the development of numerous applications for hydrocarbon (oil and gas) well exploration and production such as drilling performance monitoring, formation evaluation, downhole multiphasic flow imaging, fluid entries identification during logging, fluid phases changes detection, sand production evaluation, casing and pipe corrosion monitoring, etc. . . . . .

Other advantages will become apparent from the hereinafter description of the invention.

BRIEF DESCRIPTION OF THE DRAWINGS

The present invention is illustrated by way of examples and not limited to the accompanying drawings, in which like references indicate similar elements:

FIGS. 1A and 1B are cross-section views schematically illustrating downhole ultrasonic transducers according to the prior art;

DETAILED DESCRIPTION

The invention will be understood from the following description, in which reference is made to the accompanying drawings.

Figure 2:
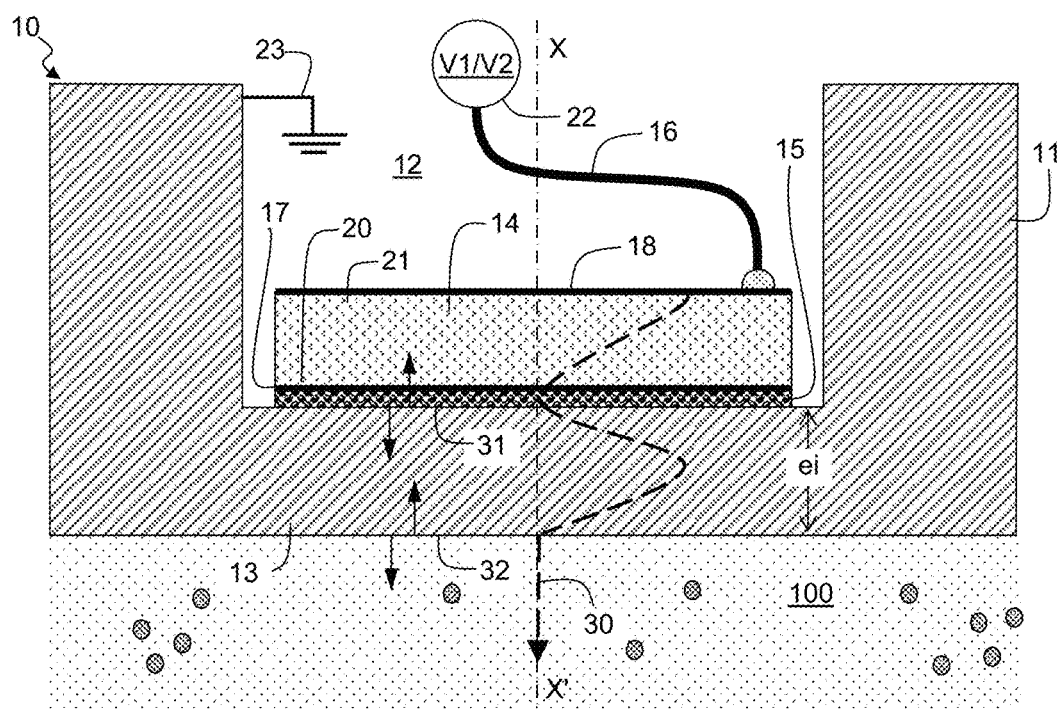
FIG. 2 is a cross-section view schematically illustrating an exemplary embodiment of downhole ultrasonic transducer of the invention.

FIG. 2 is a cross-section view schematically illustrating an exemplary embodiment of a downhole ultrasonic transducer 10 of the invention.

The downhole ultrasonic transducer 10 comprises a housing 11, an internal cavity 12, a membrane wall 13, a piezoelectric element 14, a mechanical coupling means 15, and electrical coupling means 16, 17, 18. The downhole ultrasonic transducer 10 may also include a control circuit 22.

In the present example, the downhole ultrasonic transducer 10 has a general cylindrical shape of longitudinal symmetry axis XX'. More precisely, the piezoelectric element 14 has a disk shape, and the housing 11, the internal cavity 12 and the membrane wall 13 have a cylindrical shape. The membrane wall 13 and the disk shaped piezoelectric element 14 extend perpendicularly to the longitudinal symmetry axis XX'.

The housing 11 is made of metal or metallic alloy. The metal housing 11 defining the internal cavity 12. The internal cavity 12 is isolated from an external environment 100 by the membrane wall 13. In the following description, the external environment 100 is intended to mean the harsh downhole environment including high temperature (up to 200° C.), high pressure (up to 2.000 bars) and corrosive fluid wherein the downhole ultrasonic transducer performs acoustic measurements. These measurements may be related to the well bore itself (well bore diameter, well bore shape, casing corrosion, etc. . . . ), or to fluid flowing into such well bore or pipe involved in the exploitation of the well (e.g. drilling mud, multiphase fluid mixtures, production fluid, etc. . . . ). The membrane wall 13 is made of metal or alloy. More precisely, the housing 11 comprises the membrane wall 13 on which the piezoelectric element 14 is mounted, said membrane wall 13 having a specifically optimized thickness ei for optimal energy transfer between the piezoelectric element 14 and the external environment 100 as hereinafter described in details. In this case, the housing 11 and the membrane wall 13 may be manufactured in the same metal or alloy piece, the membrane wall 13 being then integrally formed with the housing 11. In order to withstand harsh environment, these elements are made of stainless steel, or advantageously austenite nickel-chromium-based super-alloys commercialized by Special Metals Corp./Precision Castparts Corp. under the trademark Inconel. As an example, these elements can be made of Inconel 718 having well defined composition and properties.

The piezoelectric element 14 is made of a piezoelectric ceramic. As an example, the piezoelectric element 14 is a Lead Zirconate Titanate piezoceramic disk having a thickness ranging from 0.1 mm to 1 mm and a diameter ranging from 1 mm to 10 mm. The piezoelectric element 14 is mounted inside the internal cavity 12. The piezoelectric element 14 has a front side 20 and a back side 21. The piezoelectric element 14 comprises metallization layers 17, 18 (e.g. gold, silver or other metal) on the front and back sides 20, 21, respectively. The front side 20 is mechanically coupled to the membrane wall 13. The piezoelectric element 14 is coupled to the membrane wall 13 by the mechanical coupling means 15, for example a conductive glue. Alternatively, the piezoelectric element 14 may be coupled to the membrane wall 13 by brazing, silver glass frit or eutectic bonding. The back side 21 is left free to oscillate in the internal cavity 12. In other words, there is no backing element coupled to the back side 21 of the piezoelectric element 14. Also, owing to the high acoustic impedance mismatch between the piezoelectric element 14 and the internal cavity 12 (at vacuum or low pressure or atmospheric pressure), most of the acoustic energy is transmitted to the front side 20, therefore achieving good emission performance of the transducer. Further, the back side 21 of the piezoelectric element 14 may be connected to a control circuit 22 by a wire bonding 16 (e.g. gold wire bonding) and a coaxial cable. The front side 20 of the piezoelectric element 14 may be connected to the ground 23 through the membrane wall 13 and the metal housing 11.

The cavity 12 may be under vacuum (e.g. low or medium vacuum in the range of $1-10^{-3}$ bar) or at a low pressure, typically below or equal to 4 atm. More precisely, the pressure in the cavity 12 is unrelated to the downhole pressure within the hydrocarbon well (up to 2.000 bars).

As it is known in the art, the piezoelectric element 14 converts electrical signals into ultrasonic waves, and detects ultrasonic waves by converting the detected ultrasonic waves into electrical signal. The piezoelectric element 14 can be operated as a transmitter of ultrasonic waves, or as a receiver of ultrasonic waves. Ultrasonic waves or ultrasound are acoustic waves having frequencies ranging from 20 kHz up to several gigahertz. In a transmitter mode, the piezoelectric element 14 is actuated by an appropriate electrical signal V1 provided by the control circuit 22 to emit pulses of ultrasonic waves or a continuous wave through the membrane wall 13 towards the external environment 100. As an example, the control circuit 22 comprises a waveform generator module that provides excitation sine burst in the range of 1-10 Volts. In a receiver mode, the piezoelectric element 14 receives and detects pulses of ultrasonic waves from the external environment 100 through the membrane wall 13 and generates an electrical reception signal V2. As an example, the control circuit 22 measures reception echoes signals having amplitudes ranging from a few micro-Volts to several hundreds milli-Volts depending on position, size, acoustic impedance, and other physical characteristics of reflectors present in the fluid or interfaces. The received ultrasonic energy which has travelled and has been reflected by the external environment 100 enables to infer various properties of the external environment 100. For example, these properties may be related to the mud/fluid in the borehole, detection of structures in the external environment 100, detection of solid particles/droplets/bubbles in the fluid, measurement of velocities (by measuring the Doppler shift of reflected wave), the bore hole wall, the casing, the completion and/or the formation.

When ultrasonic waves 30 propagate from the piezoelectric element 14 through material layers towards the external environment 100, they encounter partial reflection (i.e. partial transmission) at the interfaces 31, 32 between the piezoelectric element 14 and the membrane wall 13, and between the membrane wall 13 and the external environment 100 which create interference phenomena leading to optimal transmission at certain frequencies (constructive interference). This is also true when ultrasonic waves travel the other way. On the one hand, the propagation characteristics of ultrasonic waves 30 through the membrane wall 13 made of metal (or metal alloy) depends on the thickness ei of the membrane wall 13, and, on the other hand, the resistance to the high pressure applied by the external environment 100 is conditioned by an appropriate minimum thickness ei of the membrane wall 13. Below this appropriate minimum thickness, the pressure induced mechanical stress would damage the piezoelectric element 14. The ultrasonic transducer is optimized by selecting the characteristics of the piezoelectric element 14, the mechanical coupling means 15 and the membrane wall 13 so that this multilayer structure exhibits an electro-acoustic transfer function having outstanding performance parameters for the considered application (e.g. electro-acoustic transmission and reception efficiency, operating frequency, bandwidth, spatial resolution or other depending on application). As explained in more details below, for selected piezoelectric materials and geometries, this is achieved by a suitable specification of the thickness of the membrane wall 13. In addition, such thickness and the other features of the membrane wall are such as to provide an effective protection of the piezoelectric element at the highest pressure which can be expected in the external environment 100.

In order to achieve a suitable protection of the piezoelectric element, the membrane wall 13 thickness is such that the strain level on the piezoelectric element 14 stays below an elastic limit of the piezoelectric element 14 under maximum operating pressure, e.g. P=2.000 bars. This elastic limit corresponds to a maximum operating pressure causing defects inside the piezoelectric element 14.

The mathematical model of the downhole ultrasonic transducer 10 of the invention takes into account both the electro-acoustic behavior and the strain induced by the external pressure. The mathematical model is defined by the following set of equations which allows computation of the acoustic power emission efficiency APE and maximum applied pressure:

$$APE = \frac{P_{[ei]}}{P_{[ei \to 0]}}$$

with $P_{[ei]} = P_{Z0} \times A_{ceram}^2$ (P[ei->0] meaning the acoustic power emission for a thickness of the membrane wall ei reaching nil)

with $$P_{z0} = Z_0 \omega^2 \left( \frac{|x_{[L]}| \, |Z_c| \sqrt{Z_i^2 \cos(\omega T_i)^2 + Z_0^2 \sin(\omega T_i)^2}}{Z_i \times (Z_0^2 \cos(\omega T_i)^2 + Z_i^2 \sin(\omega T_i)^2)} \right)^2$$

$$\left( \frac{z_i}{\sqrt{(z_i^2 \cos(\omega T_i)^2 + Z_0^2 \sin(\omega T_i)^2)}} \right)^2$$

and $$A_{ceram} = \left| \frac{1}{1 + Rd^2 S \left( \frac{j\omega Z}{T\rho c^2} \times \left( \frac{1}{\frac{\rho c^2}{E_y} - 1} + (x_{[L]} - x_{[0]}) \right) \right)} \right|$$

-continued where $x_{[L]} = A e^{j\omega T} + B e^{-j\omega T}$ and $x_{[0]} = A + B$ with $A = \dfrac{\left(1 - \dfrac{Z_c}{Z}\right) \times e^{-j\omega T} - 1}{L - M}$ and $B = A \times \dfrac{\left(1 + \dfrac{Z_c}{Z}\right) \times e^{j\omega T} - 1}{\left(1 - \dfrac{Z_c}{Z}\right) \times e^{-j\omega T} - 1}$ where $$L = \left(1 - \frac{\rho c^2}{E_y}\right) \times \left(4 - e^{j\omega T} - e^{-j\omega T} - \left(1 + \frac{Z_c}{Z}\right) e^{j\omega T} - \left(1 - \frac{Z_c}{Z}\right) e^{-j\omega T}\right)$$

and $M = j\omega T \dfrac{\rho c^2}{E_y} \times \left( \left(1 + \dfrac{Z_c}{Z}\right) e^{-j\omega T} - \left(1 - \dfrac{Z_c}{Z}\right) e^{-j\omega T} \right)$ with $Z_C = \dfrac{1}{\dfrac{Z_i^2 + Z_0^2 + (Z_i^2 - Z_0^2) \times \cos(2\omega T_i)}{(Z_i + Z_0) + (Z_i^2 - Z_0^2) \times j \times \sin(2\omega T_i)} + \dfrac{j\omega}{K}}$ and the acceptable maximum pressure on the membrane wall is given by:

$$Pressure_{max} = \frac{1 + v^2}{E_y \varepsilon_L} \times \frac{D^2}{4e_i^2}$$

where
  APE is the acoustic power emission efficiency;
  $\rho$ is the metal volumic mass;
  $E_y$ is the Young modulus of the membrane wall;
  $v$ is the Poisson modulus of the membrane wall;
  ei is the thickness of the membrane wall;
  D is the diameter of the membrane wall on which the piezoelectric element is coupled;
  $\omega = 2\pi f$ with f being the excitation frequency;
  $e_{pz}$ is the thickness of the piezoelectric element;
  $S = \pi D^2/4$ is the surface of the piezoelectric element;
  $\varepsilon_L$ is the yield strength of the piezoelectric element (or elastic limit);
  c is the speed of sound in the piezoelectric element;
  $c_i$ is the speed of sound in the membrane wall;
  K is the stiffness of the piezoelectric element to membrane wall coupling;
  d is the piezoelectric coefficient of the piezoelectric element;
  R is the electrical generator impedance;
  Z is the acoustic impedance of the piezoelectric element;
  $Z_i$ is the acoustic impedance of the membrane wall;
  $Z_0$ is the acoustic impedance of the external environment;
  $Z_c$ is the acoustic impedance of the coupled piezoelectric element and membrane wall;
  $T = e_{pz}/c$ is the propagation time in the piezoelectric element;
  $T_i = e_i/c_i$ is the propagation time in the membrane wall; and
  j is the square root of $-1$, and e means exponential of xy.

According to the known reciprocity theorem, the above mathematical model is also valid for the computation of the downhole acoustic transducer detection sensitivity. Further, the above mathematical model includes material characteristics such as piezoelectric coupling coefficients, electrical parameters such as dielectric constants and other parameters known from the literature and the materials manufacturers specifications.

FIGS. 3A, 3B, 3C and 3D illustrate computations results obtained on a particular configuration of the downhole ultrasonic transducer from the invention allowing selecting appropriate thicknesses ei of the membrane wall 13 of the ultrasonic transducer for downhole applications. In these examples, the piezoelectric element 14 is a PZT disk made of PZ27 from Meggitt-Feroperm with a thickness of 0.25 mm, having vacuum (or a low pressure relatively to the downhole pressure within the hydrocarbon well) on its back side and coupled to the membrane wall 13 made of Inconel 718 with water as external environment.

Figure 3A:
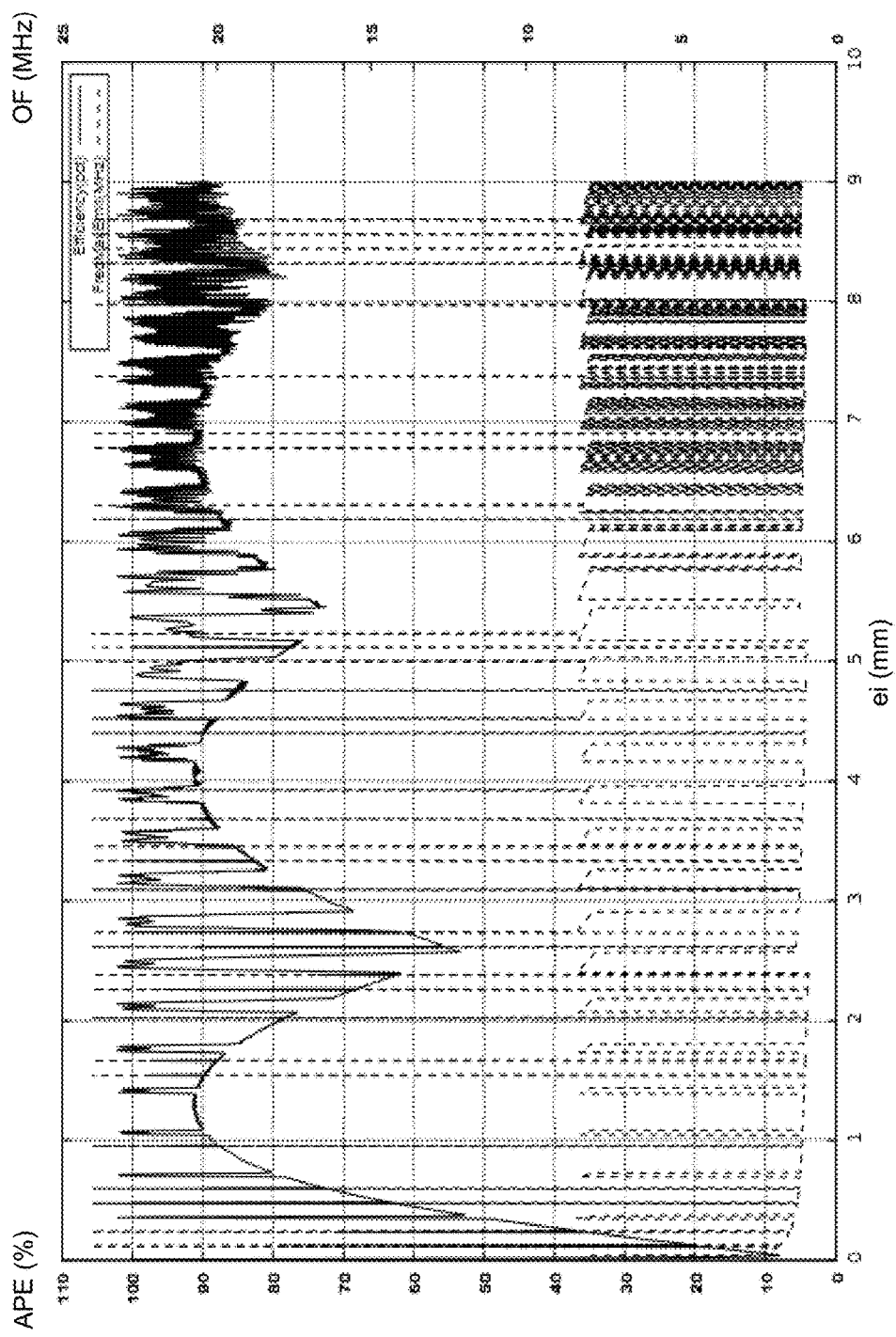
FIGS. 3A, 3B, 3C and 3D illustrate model computation results performed in order to determine an appropriate thickness of a membrane wall of the downhole ultrasonic transducer of the invention.

FIG. 3A represents the acoustic power emission efficiency APE (plain lines in %) and the value of the optimal frequency OF (dotted lines) as a function of the thickness ei of the membrane wall 13. It is to be noted that the acoustic power emission efficiency APE is expressed in % meaning that it is relative to an ultrasonic transducer which would have no membrane at all, the piezoelectric element having its front face oscillating directly in the external medium (i.e. water in the computations). The acoustic power emission efficiency APE exhibits multiple peaks, each peak being related to a high energy emission efficiency (e.g. percentage above 90%) for a determined band of membrane wall thicknesses ei corresponding to constructive interferences in the downhole ultrasonic transducer structure.

Figure 3B:
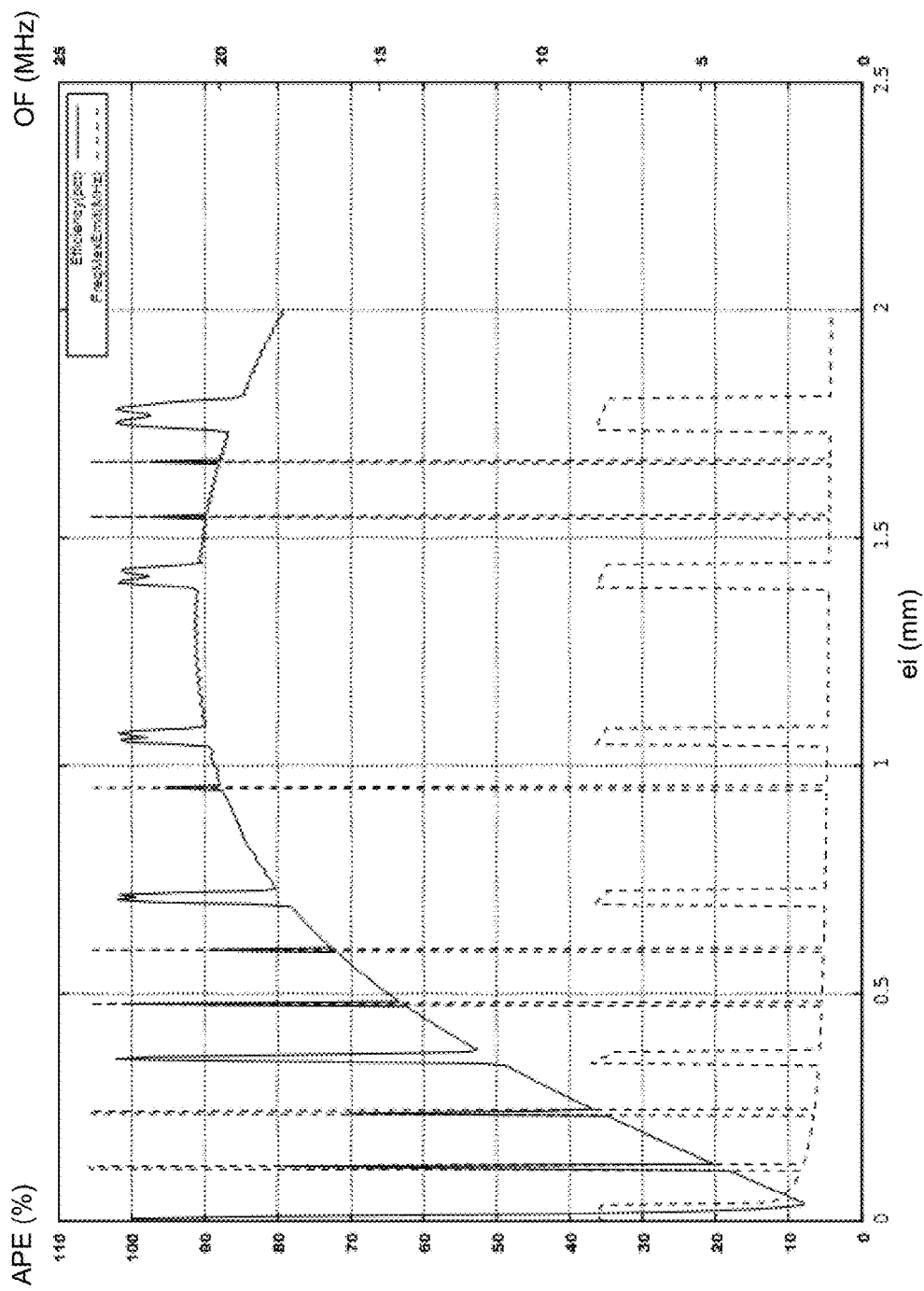

FIG. 3B represent a zoomed portion of FIG. 3A for membrane thicknesses ranging from 0 to 2 mm.

Figure 3C:
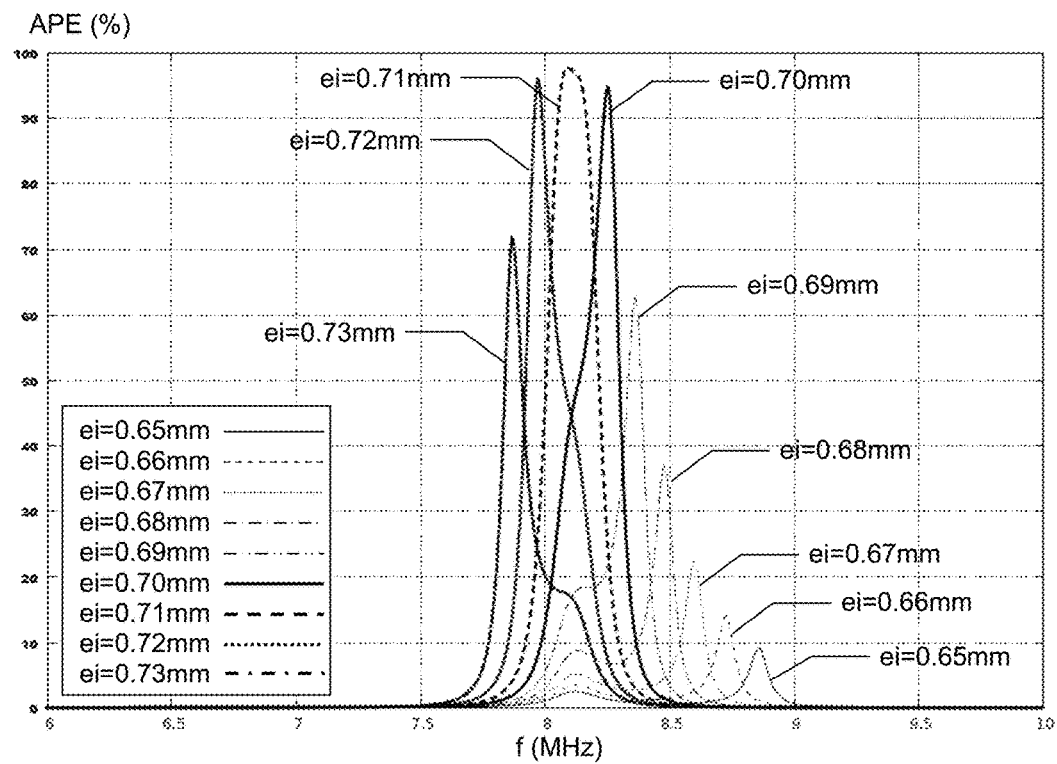
Figure 3D:
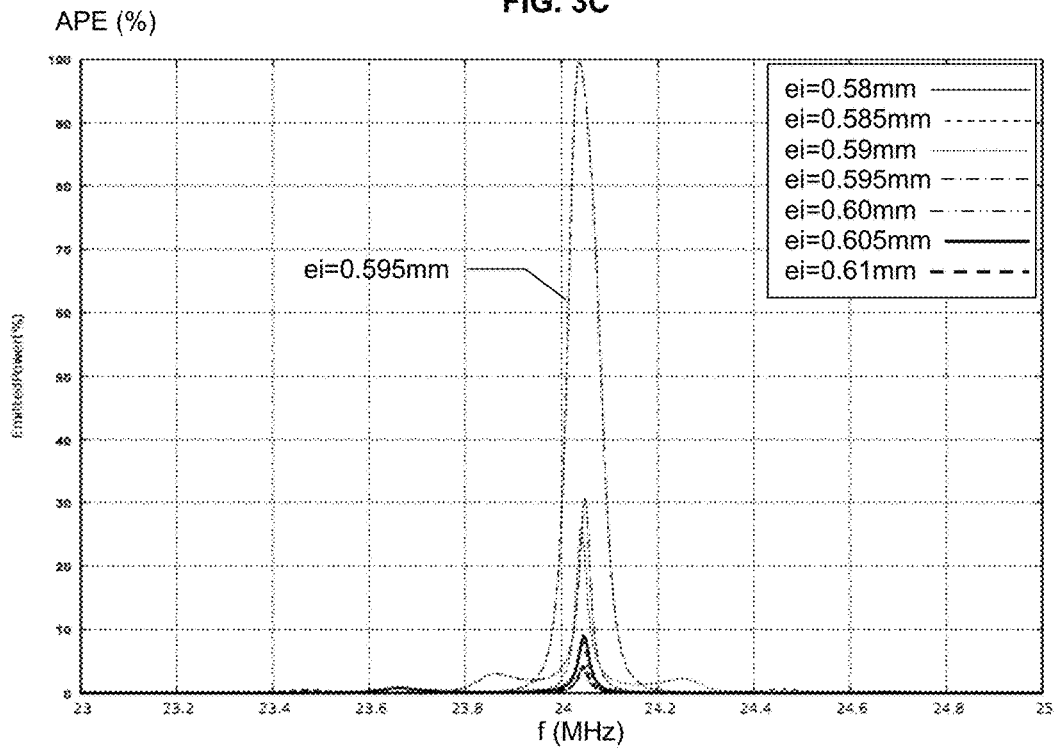

FIGS. 3C and 3D show the acoustic power emission efficiency APE optimal peaks for individual thicknesses from selected bands which are plotted against excitation frequency. The analysis of the model computation results indicates that there are particular bands of thicknesses ei for which the acoustic power emission efficiency APE is optimized. The acoustic power emission efficiency APE is a critical parameter in applications where high acoustic energy transfer to the external medium as well as high detection sensitivity are searched. In particular ultrasonic transducer designs comprising a metal membrane wall having a thickness selected in such high acoustic power emission efficiency APE bands exhibit excellent performance for single transducer Doppler type measurements. Further, there are particular bands of thicknesses ei for which higher order resonance modes can be selected (such as the ones depicted in FIG. 3D). This is of particular importance if high frequency ultrasonic transducer are desired, such as for high resolution used in imaging applications. Furthermore, it can be observed in FIGS. 3A, 3B, 3C and 3D that band widths and peak shapes vary in large proportions depending on thickness ei range. The bands can be very narrow, implying that the ultrasonic transducer performance will have a high sensitivity to membrane thickness, typically requiring an accurate control of the membrane thickness within a few micrometers, which may be difficult or expensive to manufacture. The bands can be wide, implying that the acoustic power emission efficiency APE remains high for a relatively large band of membrane thicknesses allowing an easy and low cost manufacturing control. In a similar fashion the individual peaks for selected thicknesses as described in FIGS. 3C and 3D also exhibit frequency dependence characteristics which can be used advantageously in order to optimize certain transducer performance parameters. In particular it can be seen from FIG. 3C that the peak for a membrane wall thickness ei of 0.71 mm has a large frequency band which corresponds to an ultrasonic transducer having both high acoustic power emission efficiency APE and high frequency bandwidth. Those are critical performance parameters for pulsed echo applications where high temporal resolution and high signal to noise ratio are searched.

In FIGS. 3C-3D, only curves for discrete thickness values have been depicted for a mere clarity reason. These are only particular curve examples because the computation model is also applicable in between those discrete thickness values (i.e. it is a continuum).

The model computation illustrates that there is a complexity of phenomena resulting in a variety of peaks (in term of acoustic power emission, peak shape and peak width) for determined thicknesses ei. In all case, the thickness ei of the membrane wall is such that the membrane wall isolates the piezoelectric element from stresses resulting from the pressure of the external environment. Therefore, it is possible to take advantage of particular characteristic parameters like the acoustic power emission, the peak shape and the peak width at half height in order to determine the thickness of the membrane wall so as to adapt the transducer to specific measurements, like echo measurements, time of flight measurements and continuous Doppler measurements, and to specific applications, like wireline application, production logging application, logging while drilling application and drill stem testing application.

Therefore, these acoustic power emission efficiency APE (in %) as a function of the frequency of the excitation signal V1 for different thicknesses ei of the membrane wall can be used as abacus used to determine the optimum membrane wall thickness ei that will at the same time result in an important acoustic power emission efficiency and an appropriate resistance to high pressure encountered in downhole environment.

Further, according to a simplified model, it can be considered that optimal performance of the ultrasonic transducer (maximizing acoustic transmission) is obtained for a thickness ei of the membrane wall 13 that is approximately an integer multiple of a half wavelength of the acoustic wave 30 generated by the piezoelectric element 14 and travelling inside the membrane wall 13.

In order to achieve a suitable protection of the piezoelectric element, the membrane wall 13 thickness is such that the strain level on the piezoelectric element 14 stays below an elastic limit of the piezoelectric element 14 under a maximum operating pressure, e.g. P=2.000 bars. This elastic limit corresponds to a maximum operating pressure causing defects inside the piezoelectric element 14 (The expression of the maximum operating pressure $Pressure_{max}$ has been detailed hereinbefore).

Figure 4:
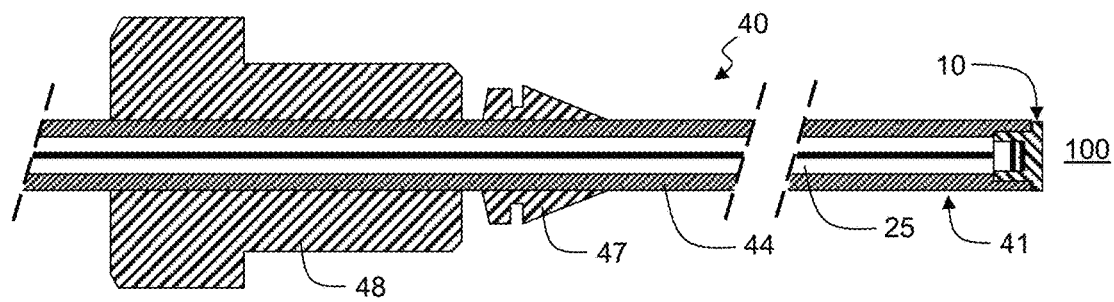
FIGS. 4 and 5 are a partial cross-section view and a perspective view, respectively, showing a first embodiment of a downhole ultrasonic probe including a single downhole ultrasonic transducer as shown on FIG. 2.
Figure 5:
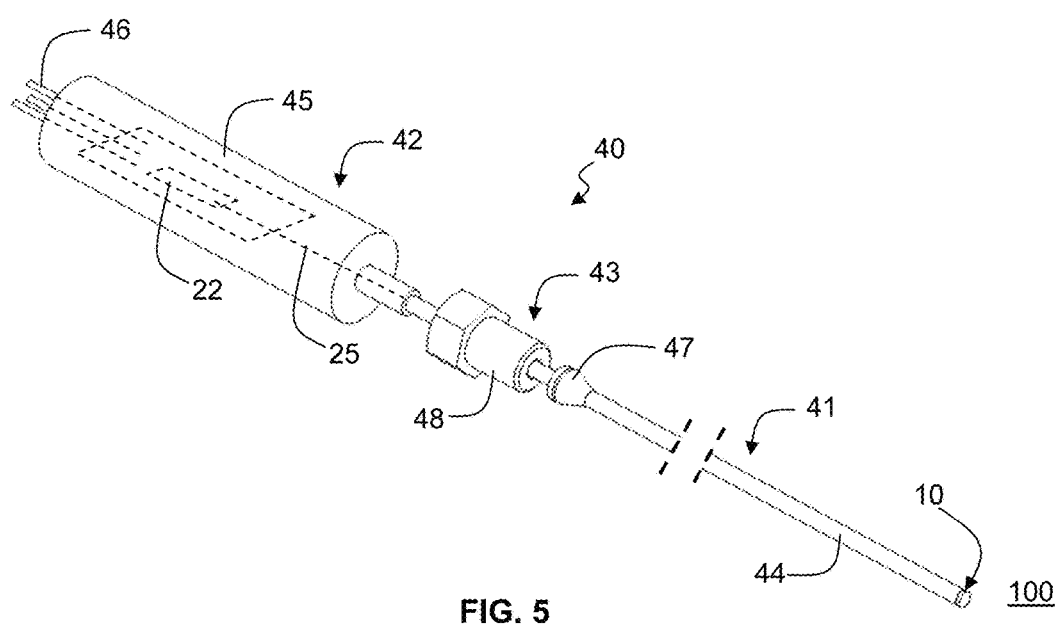

FIGS. 4 and 5 are a partial cross-section view and a perspective view, respectively, showing a first embodiment of a downhole probe 40 including the downhole ultrasonic transducer 10 of FIG. 2. As an example, a plurality of such downhole ultrasonic probes 40 may be integrated into a production logging tool 60 that is depicted in perspective in FIG. 6.

The downhole probe 40 has the general shape of an elongated cylindrical body having a tip portion 41 in contact with the external environment 100 to be analyzed (i.e. in contact with harsh environments), and a second portion 42 separated by a housing element (partly visible in FIG. 6) from the external environment 100. A probe connector 43 separates the tip portion 41 from the second portion 42. The tip portion 41 comprises a downhole acoustic transducer 10 connected to the wire 25 and a protective tube 44 surrounding the wire 25. The protective tube 44 partially surrounds the downhole acoustic transducer 10, leaving at least the distal part (at the membrane wall) of the downhole acoustic transducer 10 in contact with the external environment 100 to be analyzed. The second portion 42 comprises an electronic board (including the control circuit 22 and other processing module like the one performing the Fast Fourier Transform) coupled to the wire 25, and a protective housing

45. The electronic board may include the control circuit 22 and various processing modules achieving measurement analysis so as to deliver digital measurements on output cables 46. The protective tube 44 is made of metal or alloy. Metal or alloy offering high strength and high chemical resistance such as Inconel can suitably be used. The protective tube 44 is used to mechanically maintain the downhole acoustic transducer 10 ensuring a pressure tight connection to the wire 25, to protect the wire 25 from fluids and to hold the probe connector 43. The protective tube 44 is sealed against the downhole acoustic transducer 10 in order to avoid penetration of fluid towards the wire 25 and the second portion 42. As a particular example, the protective tube 44 has an external diameter of 0.5 mm to 3 mm, and has a length ranging from a few centimeters (e.g. 5 cm) to several tens of centimeters (e.g. 60 cm). In this exemplary embodiment, the probe connector 43 may slide onto the protective tube 44 and is sealed against the protective tube 44 once in place. The probe connector 43 is adapted to be connected to a conical shaped hole of a pipe, or into the housing of a tool. A tight connection may be achieved through a conical synthetic rubber/fluoropolymer elastomer ferule 47 (metal-elastomer seal), or a conical metal ferrules 47 (metal-metal seal). For example, synthetic rubber/fluoropolymer elastomer may be Viton fluoroelastomers a registered trademark of DuPont Performance Elastomers L.L.C. A high pressure seal connection is obtained when the screw 48 associated with the conical ferule 47 both slidingly coupled to the protective tube 44 is appropriately screwed into a threaded hole of a tool. Other waterproof and high pressure connections may be appropriate, for example a screw nut connection including an O-ring. As a further alternative the connection may be a welded connection to a hole in the pipe or into the housing of the tool.

Figure 6:
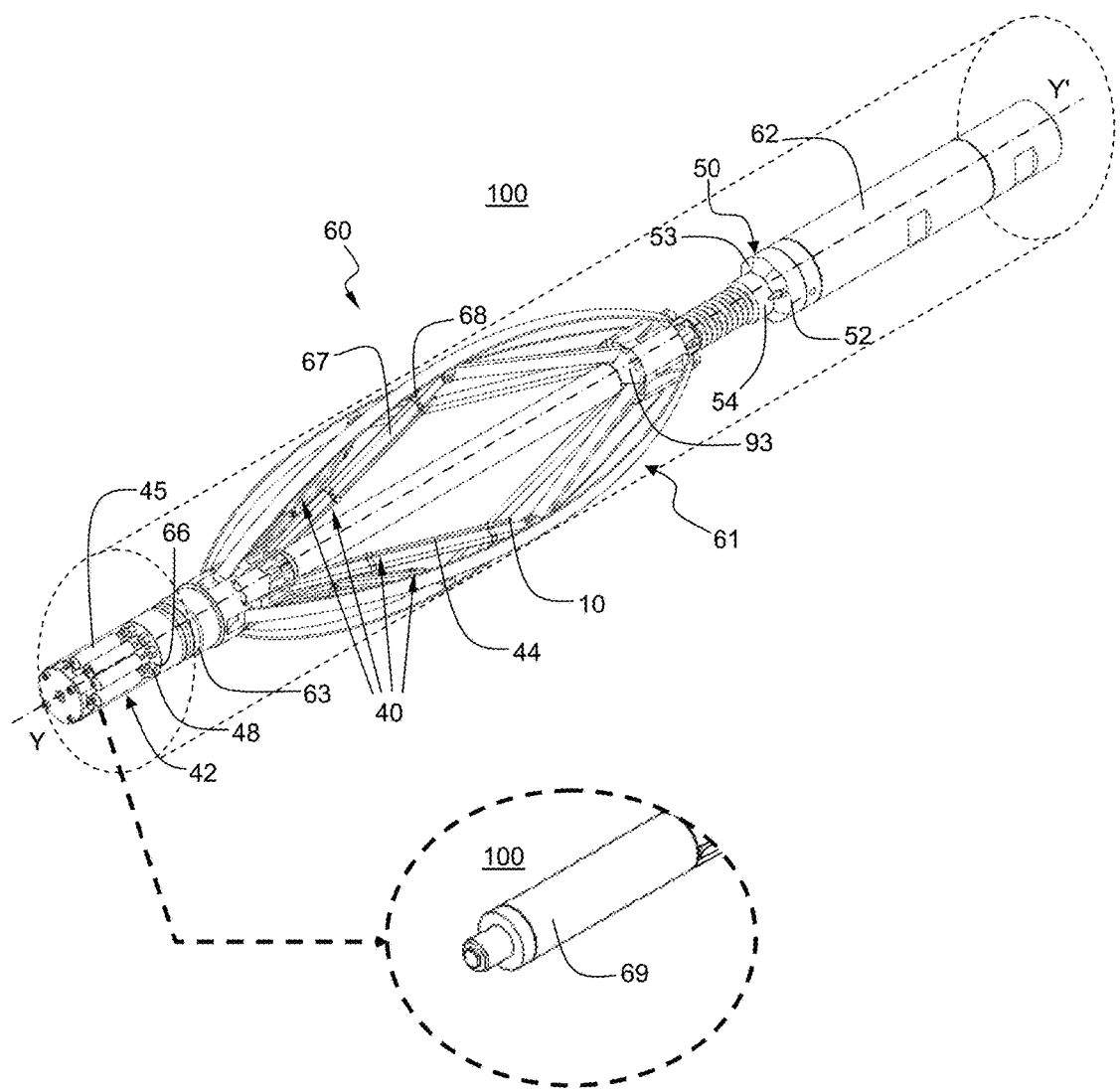
FIG. 6 is a perspective view illustrating multiple downhole ultrasonic probe of FIGS. 4 and 5 assembled in a production logging tool.

FIG. 6 schematically illustrates a production logging tool 60 comprising multiple downhole ultrasonic probes 40. The production logging tool 60 comprises a centralizer section 61 having multiple arms arranged to position the tool with respect to a pipe wall (e.g. cased hole, casing, or production pipe, etc. . . . ), an electronic sub 64 connected to the centralizer section 61 on one side, and a probes housing section 63 connected to the centralizer section 61 on another side. The production logging tool 60 may comprise various other sections and connectors as it is usual in the field of production logging tools. Each protective housing 45 of the second section 42 of each downhole ultrasonic probe 40 is received in the probes housing section 63. The probes housing section 63 is depicted as partially opened in FIG. 6 for ease of comprehension, though in practice a housing 69 further covers and protects the second section 42 from the external environment 100 (this is illustrated in a bottom detailed view). Each screw 48 is appropriately screwed into a threaded hole 66 of the probes housing section 63. Each protective tube 44 crosses through the probes housing section 63 towards the centralizer section 61. Each protective tube 44 is mechanically mounted to a corresponding deploying arm 67 of the centralizer 61 through an appropriate guiding piece 68 under the form of a ring or collar guiding and maintaining the protective tube 44 along the deploying arm 67. Therefore, each downhole ultrasonic transducer 10 positioned at the tip of each downhole ultrasonic probe 40 is deployed around the longitudinal axis YY' of the tool forming an angularly distributed array of downhole ultrasonic transducers. In this application, the flexibility of the tube shaped tip (protective tube 44 terminating by the downhole ultrasonic transducer 10) enables being deformed to follow the movements of centralizer. Therefore, with the downhole ultrasonic probe 40 having a flexible tube shaped tip and miniaturized design, it is possible to perform acoustic measurements at places difficult to reach without generating disturbance into the fluid flow. Indeed, the downhole ultrasonic probe 40 enables positioning the downhole ultrasonic transducers 10 in close proximity to the pipe wall (casing) and displacing them along with the centralizer movement in the well.

Figure 7:
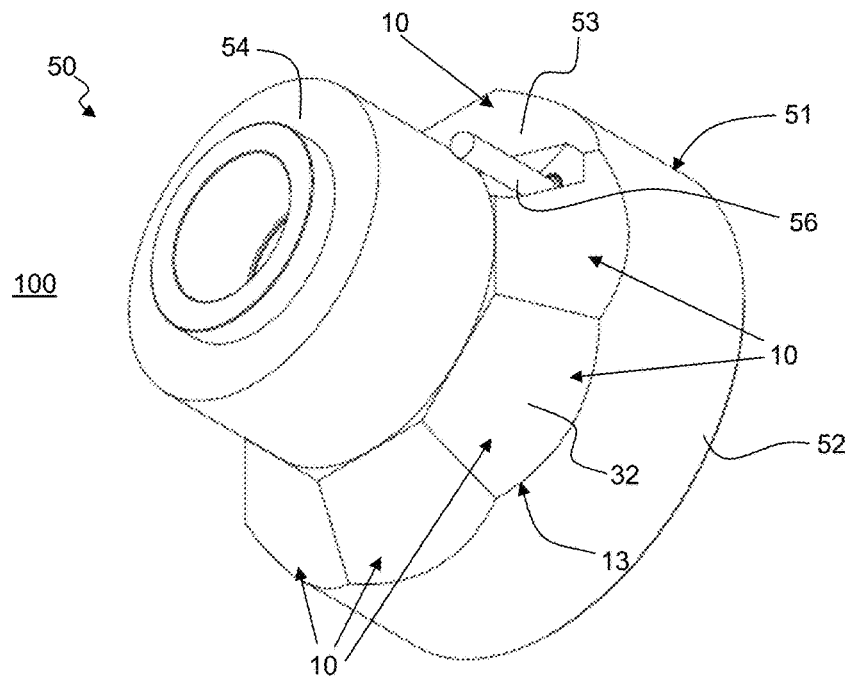
FIGS. 7, 8A and 8B are perspective front view, back view and A-A cross-section view, respectively, showing a second embodiment of a downhole ultrasonic probe including an angularly distributed array of downhole ultrasonic transducers.
Figures 8A, 8B:
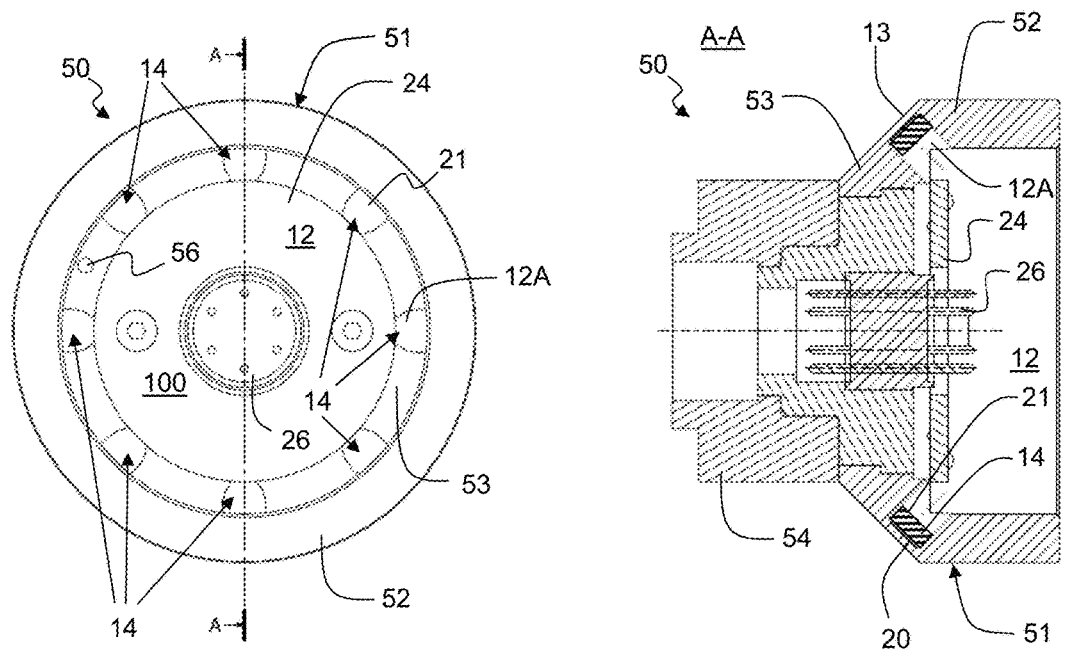

FIGS. 7, 8A and 8B are perspective front view, back view and A-A cross-section view, respectively, showing a second embodiment of a downhole ultrasonic probe 50 including an angularly distributed array of downhole ultrasonic transducers 10. As an example, this downhole ultrasonic probe 50 may be integrated into a production logging tool 60 that is depicted in perspective in FIG. 9.

In this embodiment of downhole ultrasonic probe 50, the housing 51 forms an integral part of the body of the downhole tool 60. The housing 51 comprises three sections, a first cylindrical section 52, a second conical-like multi-faceted section 53 and a third cylindrical section 54.

As better seen in the back view of FIG. 8A and A-A cross-section view of FIG. 8B, the first cylindrical section 52 is tube shaped and defines the internal cavity 12. Multiple blind holes forming sub-cavities 12A have been machined around the internal periphery of the internal cavity 12. The sub-cavities 12A are directed perpendicularly to the external surface of the second conical-like multifaceted section 53. For example, the first cylindrical section 52 comprises height sub-cavities 12A. The corresponding interface 32 between the membrane wall 13 of second conical-like multifaceted section 53 and the external environment 100 are best seen in FIG. 7 (only five are visible in FIG. 7). Each sub-cavities 12A comprises a respective piezoelectric element 14. These multiple piezoelectric elements 14 define an array of downhole ultrasonic transducers positioned in an annular fashion. The housing 51 has been further machined in order to provide the internal cavity 12 with a stepped structure so as to support centrally a printed circuit board 24 and a connector 26. The printed circuit board 24 is a connection interface between, on the one side, the metallization layer 18 on the back side 21 and the wire bonding, and, on the other side, the standard connector 26. The back side 21 of the piezoelectric element 14 is connected to the printed circuit board 24 as hereinbefore described in relation with FIG. 2 (connections are not visible for sake of drawings clarity). As explained hereinbefore, the thickness of the membrane wall 13 where each piezoelectric element 14 is mounted is specifically chosen in order to both mechanically isolate the piezoelectric element 14 from the stress induced by the outside pressure (in this application to hydrocarbon well measurements, the well pressure is up to 2000 bars) and achieve high acoustic energy transmission through multiple constructive wave reflection in the transducer structure. The ground may be taken from the housing 51 of the downhole ultrasonic probe 50, this ground is then shared between the multiple piezoelectric elements 14. The downhole ultrasonic probe 50 enables performing acoustic measurements in well defined angular sectors, each sector being associated with a particular piezoelectric element 14. The number of piezoelectric element 14 is not limited to eight. This is only an example as less or more piezoelectric element 14 may be appropriate depending on the measurement to be performed in order to characterize the external environment 100. The simple and miniaturized downhole acoustic transducer structure enables forming an array with a large number of piezoelectric elements that would not have been possible with conventional acoustic transducer.

The downhole ultrasonic probe 50 may further comprise a groove, hole and sealing for the insertion of a temperature sensor probe 56 (best seen in FIG. 7).

Figure 9:
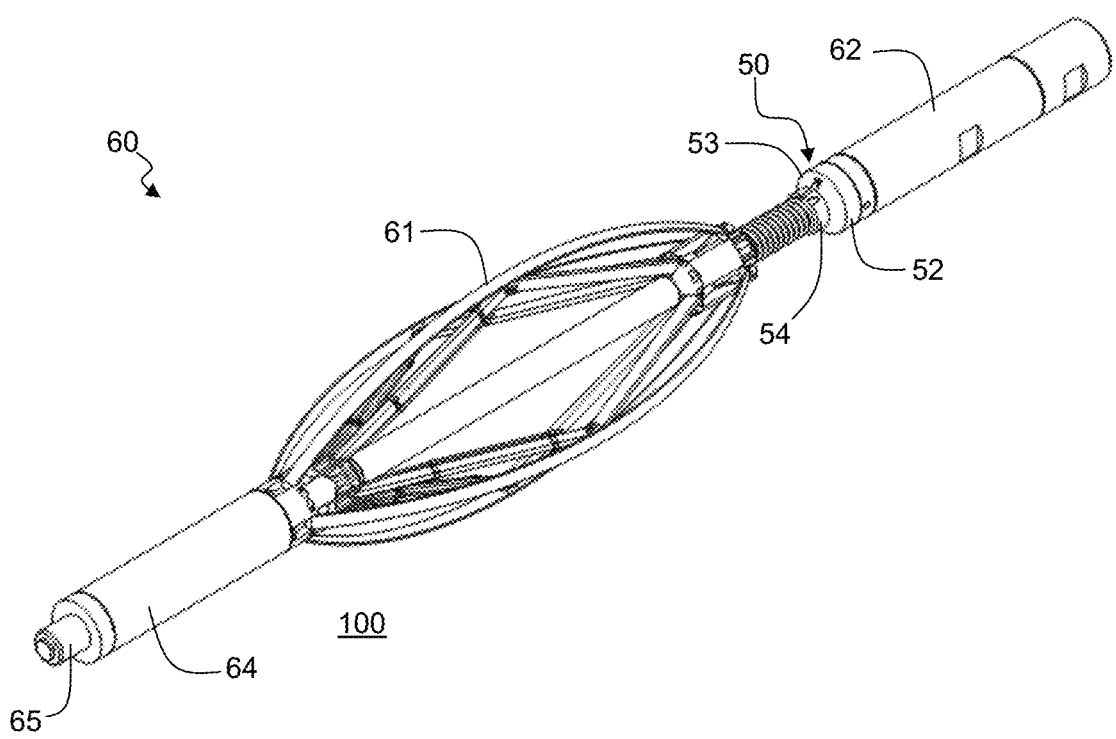
FIG. 9 is a perspective view illustrating the downhole ultrasonic probe of FIGS. 7, 8A and 8B assembled in a production logging tool.

FIG. 9 schematically illustrates a production logging tool 60 comprising the downhole ultrasonic probe 50 that is coupled to a centralizer 61 through the third cylindrical section 54, and to battery-sub 62 through the first cylindrical section 52. The production logging tool 60 may also comprises other sections like an electronic sub 64 and various connectors 65 as it is usual in the field of production logging tool. The order of these elements along the tool is only an example as other positioning is possible. The downhole ultrasonic probe 50 may also be combined with multiple downhole ultrasonic probes 40 as depicted in FIG. 6.

Figure 10:
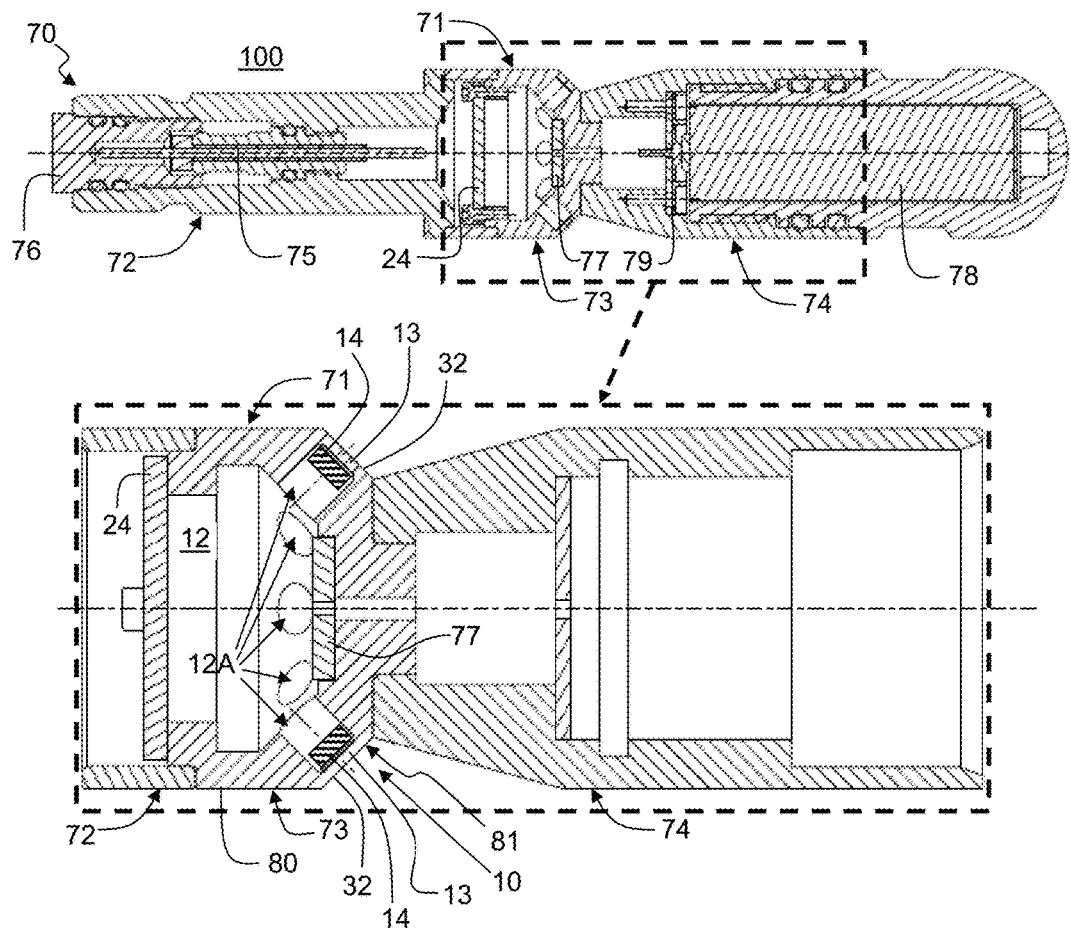
FIGS. 10 and 11 are cross-section and assembled views, respectively, showing a third embodiment of a downhole ultrasonic probe including an angularly distributed array of downhole ultrasonic transducers.
Figure 11:
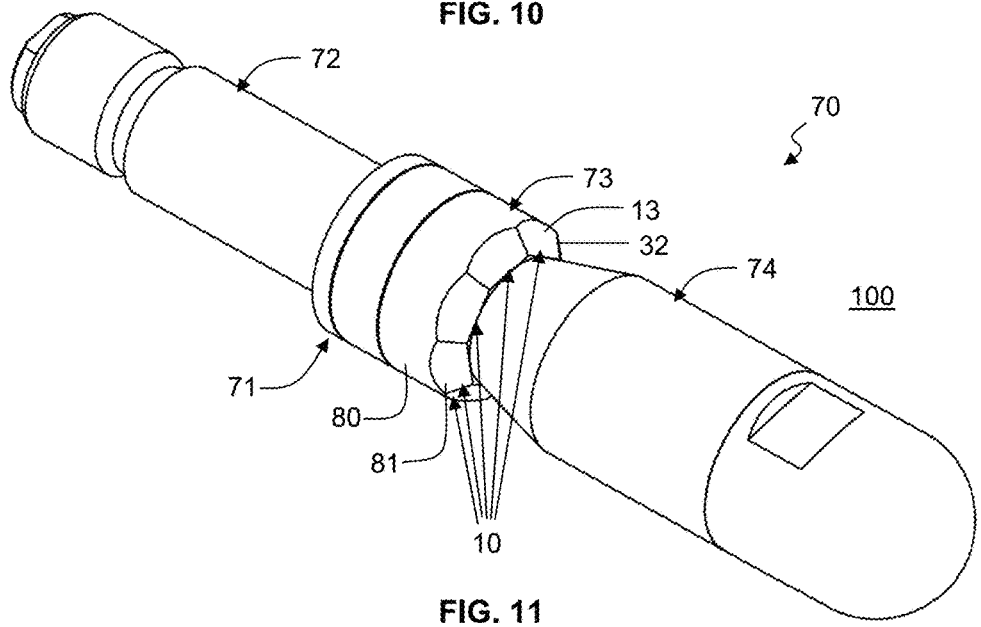

FIG. 10 shows a cross-section (top) and enlarged partial cross-section (bottom) views, respectively, illustrating a third embodiment of a downhole ultrasonic probe 70 including an array of downhole ultrasonic transducers 10. FIG. 11 is a perspective view of an assembled downhole ultrasonic probe 70.

In this embodiment of downhole ultrasonic probe 70, the body of the downhole ultrasonic probe 70 comprises three sections 72, 73 and 74. The first section 72 is coupled to the second section 73 that is further coupled to the third section 74, these sections being assembled together (e.g. by welding). The first section 72 is a connector section having a tube shape and comprising a connector feedthrough 75 and a plug 76. The second section 73 comprises the array of downhole ultrasonic transducers 10, a printed circuit board 24 (e.g. including a control circuit, a processing circuit, etc. . . . ), a terminal board 77, the internal cavity 12 and multiple blind holes forming sub-cavities 12A receiving the respective piezoelectric element 14. The third section 74 is a battery section having a battery 78 and a battery printed circuit board 79. This is only an example as each section can further include sub-sections.

Similarly to the embodiment of FIGS. 7, 8A and 8B, the housing 71 forms an integral part of the body of the downhole tool 70. The housing 71 comprises a first cylindrical part 80 followed by a second conical-like multifaceted part 81. The first cylindrical part 80 is tube shaped and defines the internal cavity 12. Multiple blind holes forming sub-cavities 12A have been machined around the internal circumference of the internal cavity 12 into the second conical-like multifaceted part 81. The sub-cavities 12A are directed perpendicularly to the external surface of the second conical-like multifaceted part 81. For example, height sub-cavities 12A (only five are visible in FIG. 10) are disposed around the internal circumference. The corresponding interface 32 between the membrane wall 13 of the second conical-like multifaceted part 81 and the external environment 100 are best seen in the enlarged view FIG. 10 (bottom) and FIG. 11 (only five are visible). Each sub-cavities 12A comprises a respective piezoelectric element 14. These multiple piezoelectric elements 14 define an array of downhole ultrasonic transducers that are disposed annularly. The thickness of the membrane wall 13 is chosen similarly to the second embodiment. Each back side 21 of the piezoelectric element 14 is connected to the control circuit 24 through the terminal board 77 as hereinbefore described in relation with FIGS. 2 and 3 (wire connections are not visible for sake of drawings clarity). The ground may be taken from the housing 71 of the downhole ultrasonic probe 70, this ground being then shared between multiple piezoelectric elements 14. The downhole ultrasonic probe 70 enables performing acoustic measurements in well defined angular sectors, each sector being associated with a particular piezoelectric element 14. The number of piezoelectric element 14 is not limited to eight. This is only an example as less or more piezoelectric element 14 may be appropriate depending on the required measurement to be performed in order to characterize the external environment 100.

The third section 74 is also tube shaped with a conical part at the side coupled to the second conical-like multifaceted part 81 in order to match at its end the general diameter of the downhole ultrasonic probe 70 because of the angled arrangement of the piezoelectric elements with respect to the longitudinal axis.

Figure 12:
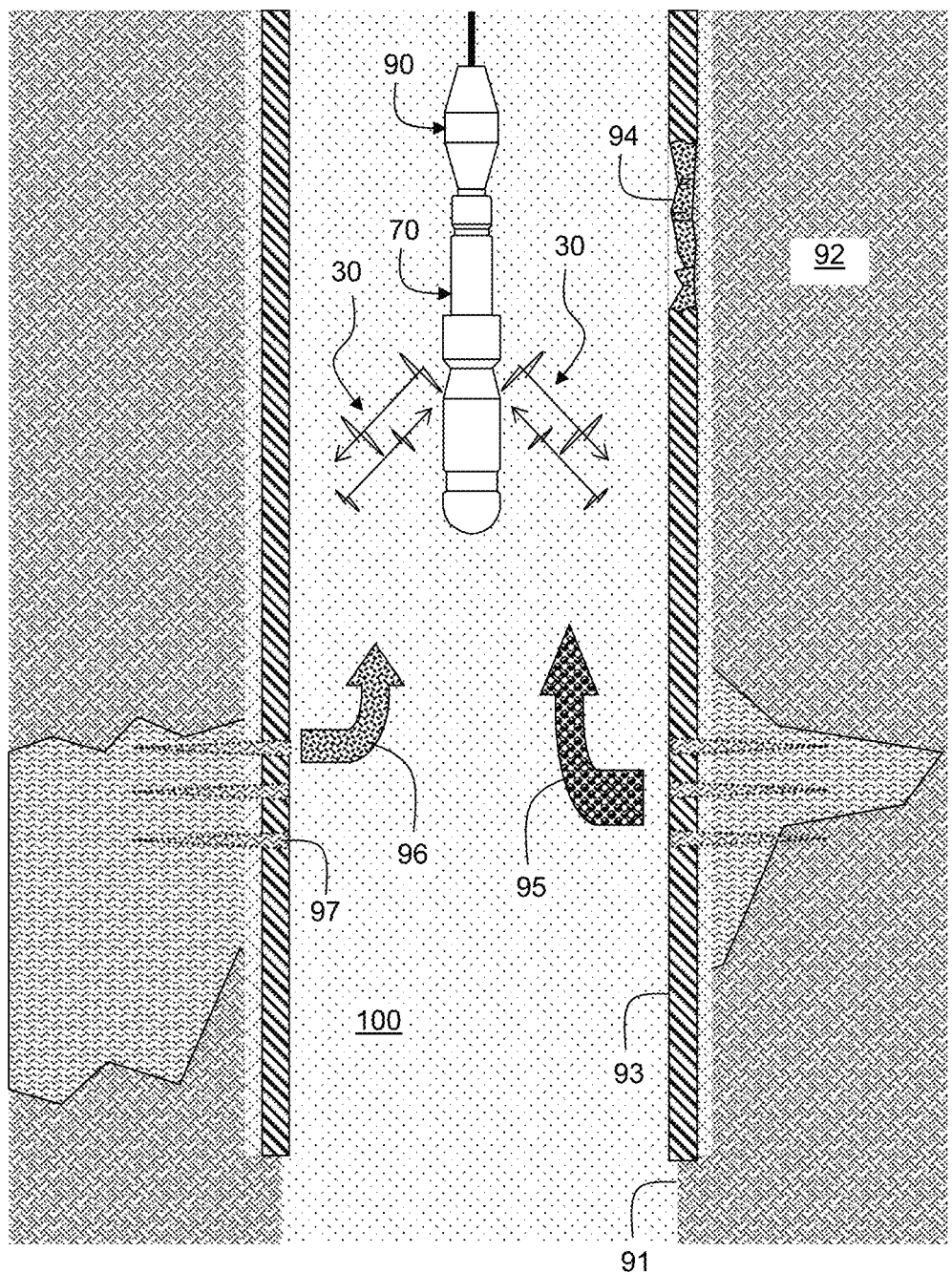
FIG. 12 is cross section views illustrating the downhole ultrasonic probe of FIGS. 10 and 11 assembled in a downhole tool that is performing acoustic Doppler, echo amplitude and time of flight measurements in a borehole of a hydrocarbon well drilled into a subterranean formation.

As an example, this downhole ultrasonic probe 70 may be incorporated into a downhole tool 90 that is depicted in FIG. 12. The downhole tool 90 may comprise various sub sections having different functionalities and coupled to surface equipments through a wireline that are well known in the oilfield industry, thus not shown and described in details herein. There are numerous acoustic measurements possible with such a downhole tool 90 while it is displaced along and within a well bore 91 of a hydrocarbon well drilled into a subterranean formation 92. The well bore may also comprise a cased portion 93. The cased portion 93 may comprise corroded zone 94 and perforated zone 97. The downhole ultrasonic probe 70 may be used to detect corroded zone 94, moving particles or droplets 95, and/or fluid entries 96.

Figure 13A:
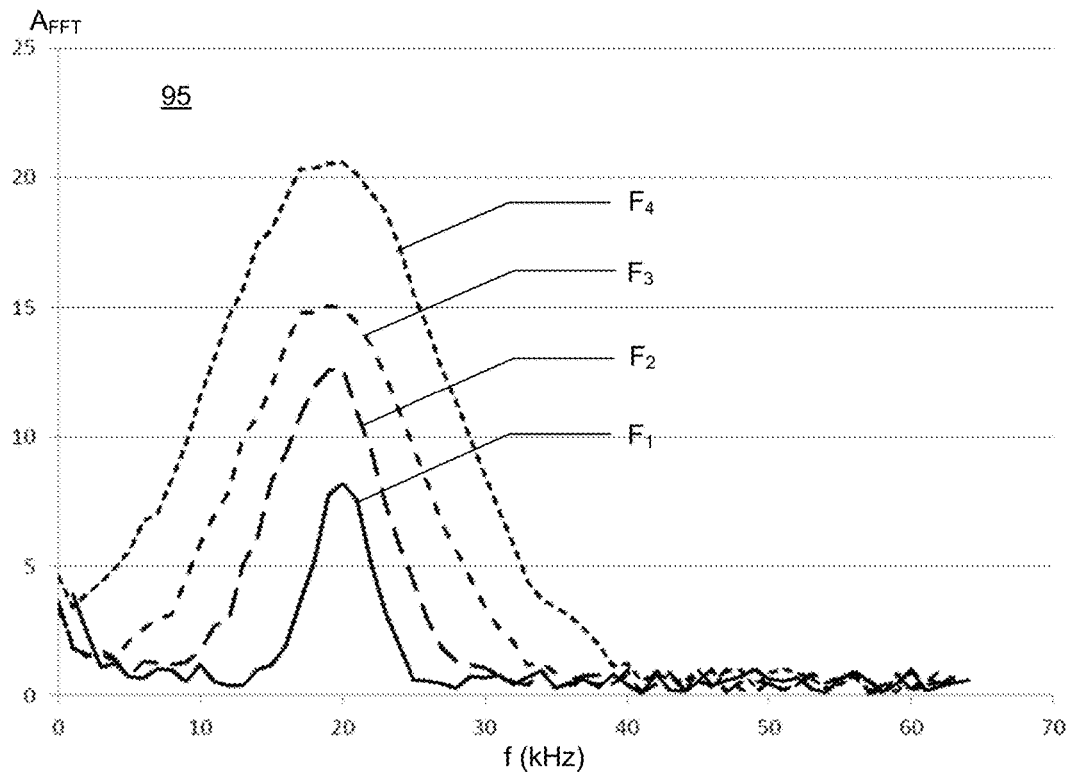
FIGS. 13A, 13B and 14 illustrate measurements performed with the downhole tool of FIG. 12; and visualization examples for well production diagnosis application.
Figure 13B:
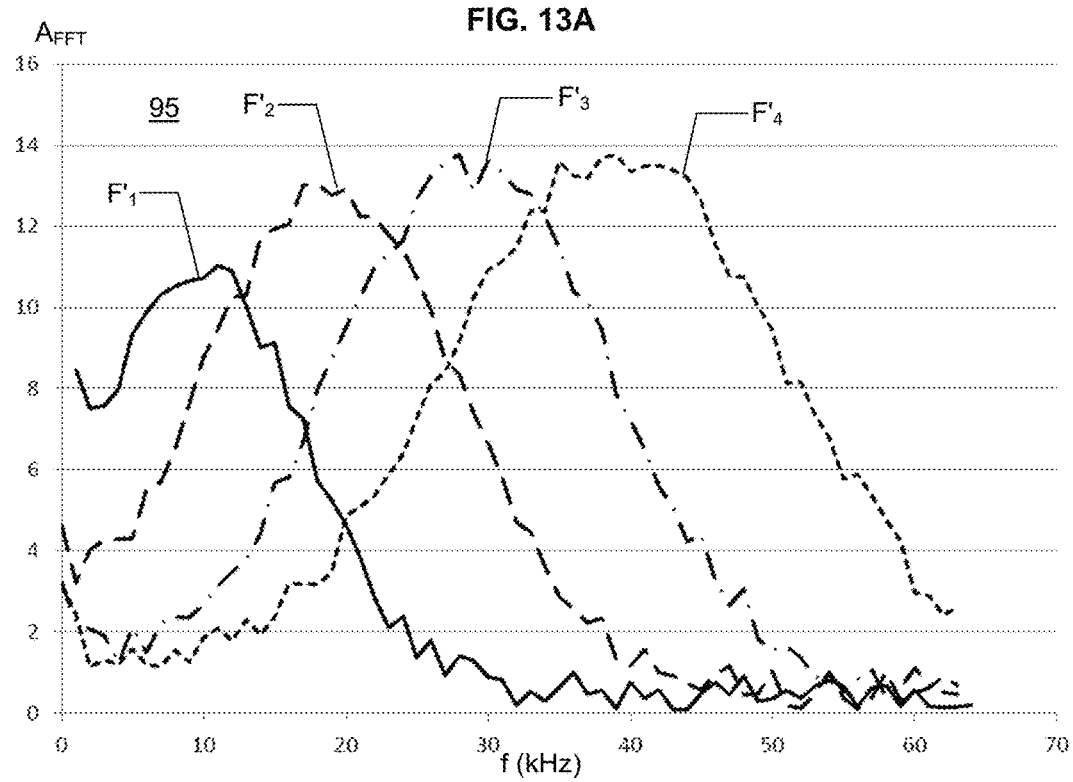

As examples, FIGS. 13A and 13B show Doppler measurements (Amplitude $A_{FFT}$ following a Fast Fourier Transform applied to the measurements) related to acoustic wave reflection from moving particles or droplets 95 at different positions in a well bore. The reflected energy relates to droplets/particle size and concentration. The frequency shift relates to droplets/particle velocity. In this example, a fluid including moving particles or droplets flows towards a downhole ultrasonic probe 70. The downhole ultrasonic probe 70 emits acoustic waves at a frequency around 10 MHz. The moving particles or droplets reflect such acoustic waves shifting its frequency. The reflected signal delivered by a downhole ultrasonic transducer is submitted to a known in the art frequency analysis (mixing and Fast Fourier Transform). The amplitude is related to the number and size of moving particles or droplets. FIG. 13A illustrates how the increase of the amplitude gives a measurement regarding the flow-rate of various increasing holdups $F_1$, $F_2$, $F_3$ and $F_4$. In this example, there are more moving particles or droplets in the flow $F_4$ than in the flow $F_1$. The fact that the frequency is similar for the four signals indicates that all the moving particles or droplets have a similar velocity. FIG. 13B illustrates how the shift in frequency gives a measurement regarding the velocity of the moving particles or droplets in various flows $F'_1$, $F'_2$, $F'_3$ and $F'_4$. In this example, the speed of the moving particles or droplets in the flow $F'_4$ is greater than the speed in the flow $F'_1$. In the above described example, the flows $F_4$ and $F'_4$ may be measurements obtained in the front of the perforated zone 97 of the cased portion 93 of the well bore 91 (see FIG. 12).

Figure 14:
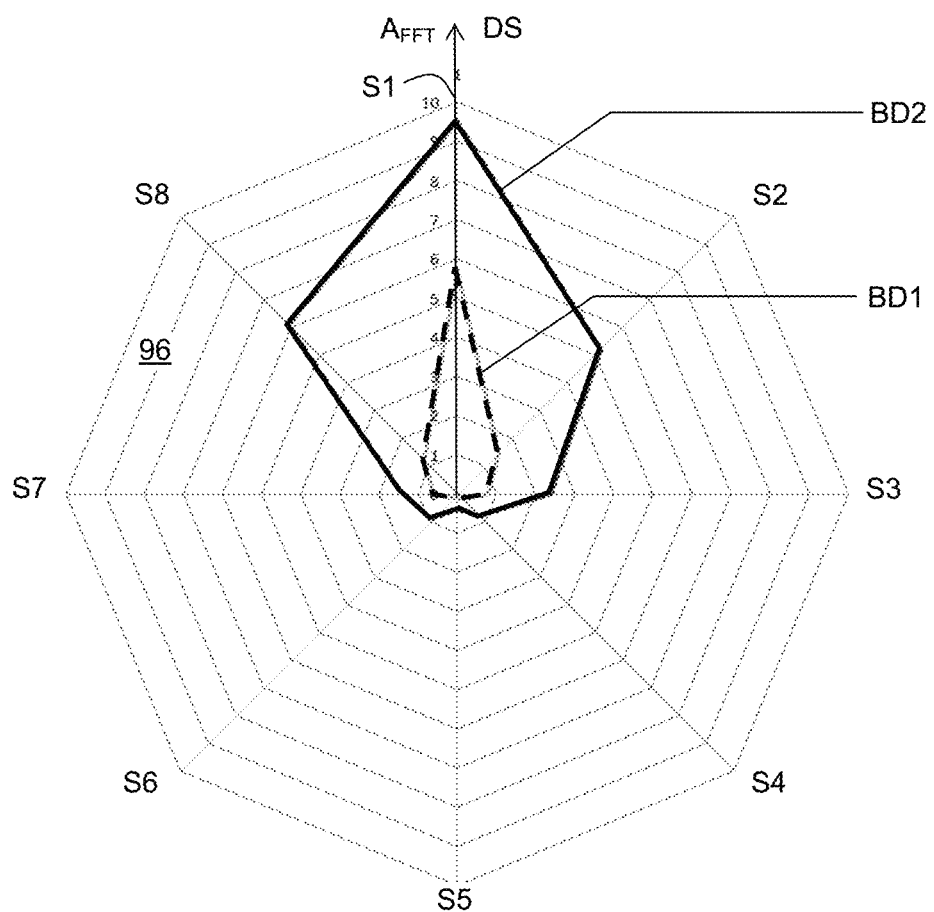

As another example, FIG. 14 show a mapping type representation of measurements related to acoustic wave reflection from the angular sectors S1, S2, S3, S4, S5, S6, S7 and S8 around the downhole ultrasonic probe 70. This is a global representation of multiple measurements similar to those of FIGS. 13A and 13B using an angularly distributed array of downhole ultrasonic transducers. In particular, in the present example, the Doppler shift in frequency BD1 (dotted line DS) and in amplitude BD2 (plain line $A_{FFT}$) can be used to visualize and position in sector S1 the fluid entries 96 from hydrocarbon bearing zones of the subterranean formation into the well borehole 91. By correlating the position of sector S1 with the orientation of the downhole tool 90, it is possible to precisely position gas flow into the well bore.

Figure 15A:
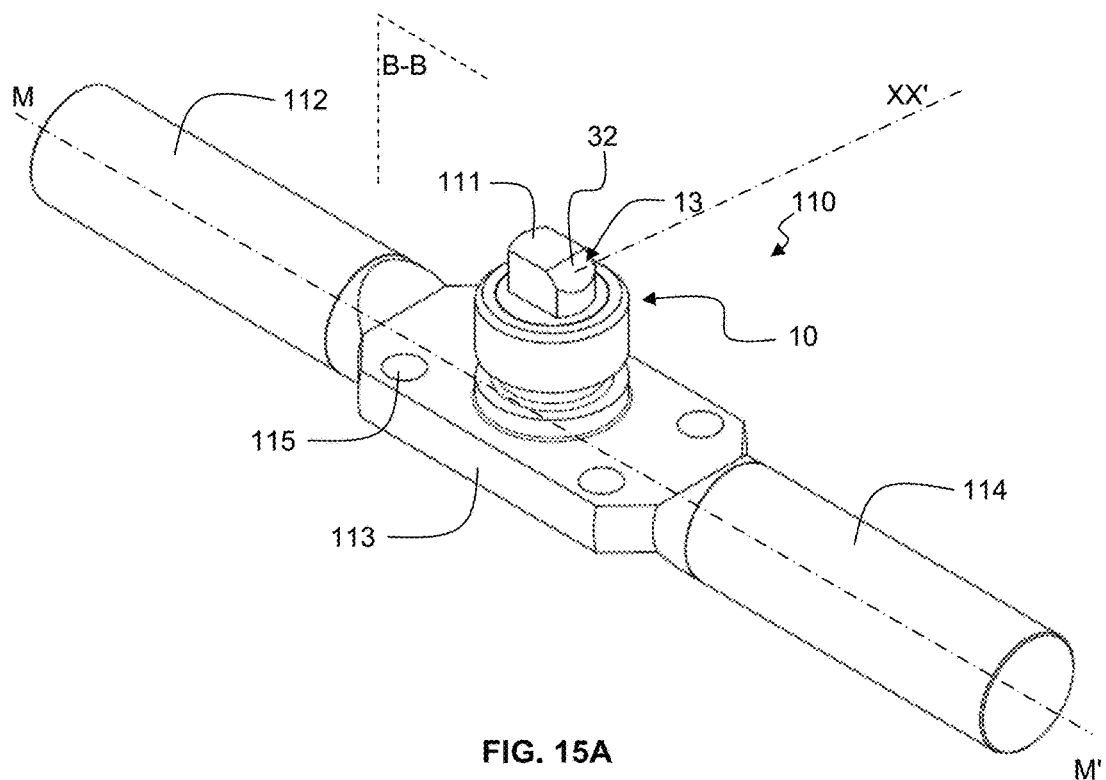
FIGS. 15A and 15B are perspective and partial cross-section views, respectively, showing a fourth embodiment of a downhole ultrasonic probe including a single downhole ultrasonic transducer.
Figure 15B:
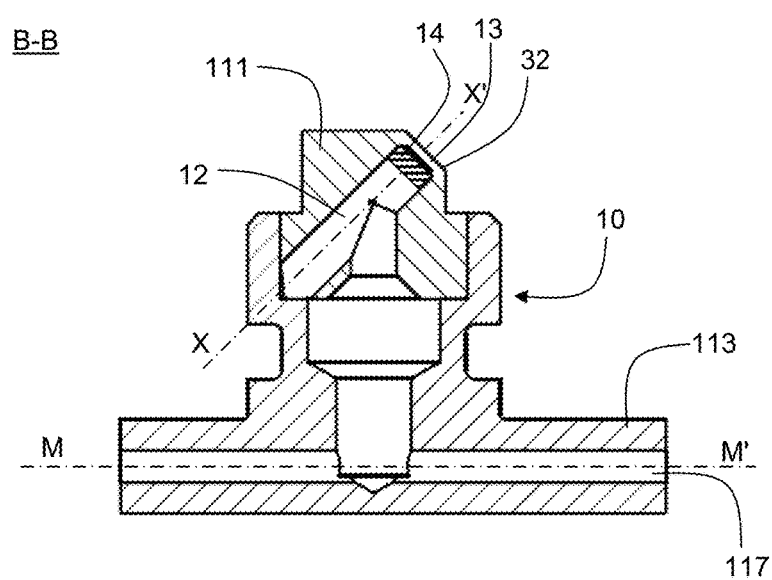
Figure 16:
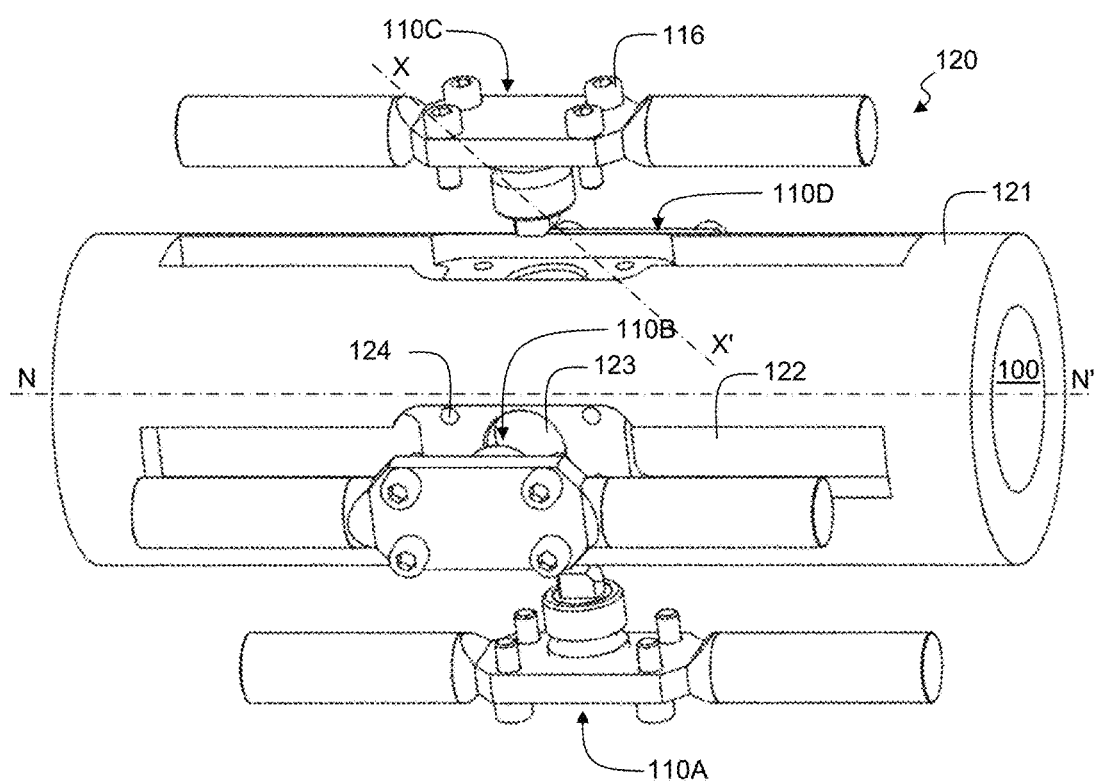
FIG. 16 is a side exploded view showing an embodiment of a downhole pipe including multiple downhole ultrasonic probe of FIG. 15 disposed around the periphery of the downhole pipe.

FIG. 15A is a perspective view showing a fourth embodiment of a downhole ultrasonic probe 110 including a single downhole ultrasonic transducer 10. FIG. 15B is a cross-section view according to the plane B-B of FIG. 15A partially showing said fourth embodiment. FIG. 16 is a side exploded view showing an embodiment of a downhole pipe 121 including multiple downhole ultrasonic probe 110A, 110B, 110C and 110D of FIG. 15A disposed around the periphery of the downhole pipe. In this embodiment, the downhole ultrasonic transducer 10 that has been described in relation with FIG. 2 is mounted on a supporting plate 113. The supporting plate further comprises multiple holes 115 used to couple the supporting plate 113 on the downhole pipe 121 by means of screws 116 and threaded holes 124. A first cylindrically shaped housing forming a battery module 112 and a second cylindrically shaped housing forming an electronic board module 114 are longitudinally connected along the longitudinal axis MM' to the downhole ultrasonic transducer 10 on both side of the supporting plate 113. Connectors (not show) electrically connect the downhole ultrasonic transducer 10 to the battery module 112 and to the electronic board module 114 through an appropriate feedthrough 117 (visible in FIG. 15B). The downhole ultrasonic transducers 110 differs from the downhole ultrasonic transducers 10 of FIG. 2 in that it comprises a projecting element 111 that enables directing the piezoelectric element 14 towards an inclined direction XX' with respect to the longitudinal axis MM', for example at an angle of 45°. The downhole pipe 121 defines an internal tubing where a fluid mixture 100 flows and comprises multiple groves 122 and holes 123 regularly disposed around a circumference of the downhole pipe 121. Each grove 122 and hole 123 receives a downhole ultrasonic transducer 110A, 110B, 110C and 110D (partially visible). Once in place, the downhole ultrasonic transducers 110A, 110B, 110C and 110D transmits and receives acoustic signals at angle relatively to the longitudinal axis NN' of the downhole pipe 121. Such downhole pipe 121 may be used for production monitoring into producing hydrocarbon well, or drill stem testing (also known as DST application). The present embodiment offers a compact structure that enables performing various measurements, e.g. flow rate measurements, type of flow (detection of the presence of gas bubbles), detection of particles (e.g. sand particles) and speed of those particles, etc. . . . .

The downhole ultrasonic transducer of the invention has the following advantages over the known downhole ultrasonic transducer:

A simple compact miniaturized design having high emission and reception performance, low power requirements and low manufacturing cost;

It is well adapted for downhole oil and gas well applications (that implies harsh environment as above described);

It is well adapted to perform various type of acoustic measurements (distance, speed, flow-rate, etc. . . . ); and It can be easily integrated in various downhole tool for various application, e.g. logging application, logging while drilling application, production monitoring application, drill stem testing application, etc. . . . .

The drawings and their description hereinbefore illustrate rather than limit the invention.

It should be appreciated that embodiments of the present invention are adapted to wells having any deviation with respect to the vertical. In the frame of the oilfield industry, all the embodiments of the present invention are equally applicable to cased and uncased borehole (open hole), and also other kind of downhole conduits or downhole device where a fluid may flow. Furthermore, the fluid may be flowing or at rest/static in the conduit. Furthermore, while the embodiments have been shown wherein the downhole ultrasonic transducers are directed according to particular direction with respect to the well or the pipe, these are only non-limitative example as other angles (e.g. 0°, 30°, 45°, 90°, etc. . . . ) may be more suitable in order to perform specific measurements. Furthermore, each downhole ultrasonic transducer can be used as purely transmitter, or purely receiver, or both alternatively as transmitter and as receiver. When a first downhole ultrasonic transducer is used as a transmitter and a second downhole ultrasonic transducer is used as a receiver, time of flight type measurements can be performed.

The invention claimed is:

1. A downhole ultrasonic transducer used to transmit and/or receive ultrasonic waves in a hydrocarbon well where a fluid is present comprising:
   a metal housing defining an internal cavity isolated from the fluid of the hydrocarbon well by a membrane wall made of metal or metal alloy;
   a piezoelectric element mounted inside the internal cavity, the piezoelectric element having a front side mechanically coupled on the membrane wall;
   wherein:
   the internal cavity is at a pressure unrelated to a downhole hydrocarbon well pressure;
   a back side of the piezoelectric element is arranged to be free to oscillate in the internal cavity so as to generate a high acoustic impedance mismatch between the piezoelectric element and the internal cavity at the back side and to maximize acoustic transmission at the front side; and
   a thickness of the membrane wall is such that there is a common resonance between the membrane wall and the piezoelectric element thereby achieving high acoustic transmission through the membrane wall, and such that the membrane wall is suitable to resist to the downhole hydrocarbon well pressure.

2. The transducer of claim 1, wherein the thickness ei of the membrane wall is selected from the group comprising thicknesses corresponding to bands of high acoustic power emission/reception efficiency APE, thicknesses corresponding to bands of low sensitivity to thickness ei variation, thicknesses corresponding to bands of large peak frequency bandwidth, and thicknesses corresponding to bands of high order modes of resonance of the piezoelectric element, and wherein such bands corresponds to a maximum acoustic transmission and high pressure operation using a predetermined mathematical model.

3. The transducer of claim 2, wherein mathematical model is given by the expression defining the acoustic power emission efficiency APE) and an acceptable maximum pressure on the membrane wall:

$$APE = \frac{P_{[ei]}}{P_{[ei \to 0]}}$$

with $P_{[ei]} = P_{Z0} \times A_{ceram}^2$ with $$P_{z0} = Z_0 \omega^2 \left( \frac{|x_{[L]}| \, |Z_c| \sqrt{Z_i^2 \cos(\omega T_i)^2 + Z_0^2 \sin(\omega T_i)^2}}{Z_i \times (Z_0^2 \cos(\omega T_i)^2 + Z_i^2 \sin(\omega T_i)^2)} \right)^2$$

$$\left( \frac{z_i}{\sqrt{(z_i^2 \cos(\omega T_i)^2 + Z_0^2 \sin(\omega T_i)^2)}} \right)^2$$

and $$A_{ceram} = \left| \frac{1}{1 + Rd^2 S \left( \frac{j\omega Z}{T \rho c^2} \times \left( \frac{1}{\rho c^2 - 1} + (x_{[L]} - x_{[0]}) \right) \right)} \right|$$

where $x_{[L]} = Ae^{j\omega T} + Be^{-j\omega T}$ and $x_{[0]} = A + B$ with $A = \dfrac{\left(1 - \frac{Z_c}{Z}\right) \times e^{-j\omega T} - 1}{L - M}$ and $B = A \times \dfrac{\left(1 + \frac{Z_c}{Z}\right) \times e^{j\omega T} - 1}{\left(1 - \frac{Z_c}{Z}\right) \times e^{-j\omega T} - 1}$ where $$L = \left(1 - \frac{\rho c^2}{E_y}\right) \times \left(4 - e^{j\omega T} - e^{-j\omega T} - \left(1 + \frac{Z_c}{Z}\right) e^{j\omega T} - \left(1 - \frac{Z_c}{Z}\right) e^{-j\omega T}\right)$$

and $M = j\omega T \dfrac{\rho c^2}{E_y} \times \left( \left(1 + \frac{Z_c}{Z}\right) e^{-j\omega T} - \left(1 - \frac{Z_c}{Z}\right) e^{-j\omega T} \right)$ with $Z_C = \dfrac{1}{\dfrac{Z_i^2 + Z_0^2 + (Z_i^2 - Z_0^2) \times \cos(2\omega T_i)}{(Z_i + Z_0) + (Z_i^2 - Z_0^2) \times j \times \sin(2\omega T_i)} + \dfrac{j\omega}{K}}$ and the acceptable maximum pressure on the membrane wall is given by:

$$Pressure_{max} = \frac{1 + v^2}{E_y \varepsilon_L} \times \frac{D^2}{4e_i^2}$$

where APE is the acoustic power emission efficiency, $\rho$ is the metal volumic mass, $E_y$ is the Young modulus of the membrane wall, $v$ is the Poisson modulus of the membrane wall, ei is the thickness of the membrane wall, D is the diameter of the membrane wall on which the piezoelectric element is coupled, $\omega = 2\pi f$ with f being the excitation frequency, $e_{pz}$ is the thickness of the piezoelectric element, $S = \pi D_2/4$ is the surface of the piezoelectric element, $\varepsilon_L$ is the yield strength of the piezoelectric element (or elastic limit), c is the speed of sound in the piezoelectric element, $c_i$ is the speed of sound in the membrane wall, K is the stiffness of the piezoelectric to membrane wall coupling, d is the piezoelectric coefficient of the piezoelectric element, R is the electrical generator impedance, Z is the acoustic impedance of the piezoelectric element, $Z_i$ is the acoustic impedance of the membrane wall, $Z_0$ is the acoustic impedance of the fluid of the hydrocarbon well, $Z_c$ is the acoustic impedance of the coupled piezoelectric element and membrane wall, $T = e_{pz}/c$ is the propagation time in the piezoelectric element, $T_i = e_i/c_i$ is the propagation time in the membrane wall, and j is the square root of $-1$.

4. The transducer of claim 1, wherein the thickness of the membrane wall is an integer multiple of a half wavelength of the ultrasonic waves generated or received by the piezoelectric element and travelling inside the membrane wall.

5. The transducer of claim 1, wherein the internal cavity is under a pressure ranging from 0 to 4 atm.

6. The transducer of claim 1, wherein the piezoelectric element has a disk shape, and the housing, internal cavity and membrane wall has a cylindrical shape.

7. The transducer of claim 1, wherein the piezoelectric element is made of a piezoelectric ceramic.

8. The transducer of claim 1, wherein at least the membrane wall is made of austenite nickel-chromium-based super-alloys.

9. The transducer claim 1, wherein the piezoelectric element comprises metallization layers on the front and back sides.

10. The transducer of claim 1, wherein the piezoelectric element is coupled to the membrane wall by a coupling means chosen in the group comprising conductive glue, brazing, silver glass frit or eutectic bonding.

11. The transducer of claim 1, wherein the back side of the piezoelectric element is connected to a control circuit by wire bonding, and the front side of the piezoelectric element coupled to the membrane wall of the metal housing is connected to the ground.

12. The transducer of claim 1, further comprising a projecting element directing emission of the piezoelectric element towards an inclined direction XX' with respect to a longitudinal axis MM' of the downhole ultrasonic transducer.

13. A downhole ultrasonic probe comprising a single downhole ultrasonic transducer used to transmit and/or receive ultrasonic waves in a hydrocarbon well where a fluid is present, the downhole ultrasonic transducer comprising:
a metal housing defining an internal cavity isolated from the fluid of the hydrocarbon well by a membrane wall made of metal or metal alloy;
a piezoelectric element mounted inside the internal cavity, the piezoelectric element having a front side mechanically coupled on the membrane wall;
wherein:
the internal cavity is at a pressure unrelated to a downhole hydrocarbon well pressure;
a back side of the piezoelectric element is arranged to be free to oscillate in the internal cavity so as to generate a high acoustic impedance mismatch between the piezoelectric element and the internal cavity at the back side and to maximize acoustic transmission at the front side;
a thickness of the membrane wall is such that there is a common resonance between the membrane wall and the piezoelectric element thereby achieving high acoustic transmission through the membrane wall, and such that the membrane wall is suitable to resist to the downhole hydrocarbon well pressure;
and wherein said downhole ultrasonic transducer is positioned at a tip of an elongated and flexible protective tube.

14. A downhole ultrasonic probe (50) comprising multiple downhole ultrasonic transducers, each downhole ultrasonic transducer being used to transmit and/or receive ultrasonic waves in a hydrocarbon well where a fluid is present, each downhole ultrasonic transducer comprising:
a metal housing defining an internal cavity isolated from the fluid of the hydrocarbon well by a membrane wall made of metal or metal alloy;
a piezoelectric element mounted inside the internal cavity, the piezoelectric element having a front side mechanically coupled on the membrane wall;
wherein:
the internal cavity is at a pressure unrelated to a downhole hydrocarbon well pressure;

a back side of the piezoelectric element is arranged to be free to oscillate in the internal cavity so as to generate a high acoustic impedance mismatch between the piezoelectric element and the internal cavity at the back side and to maximize acoustic transmission at the front side;

a thickness of the membrane wall is such that there is a common resonance between the membrane wall and the piezoelectric element thereby achieving high acoustic transmission through the membrane wall, and such that the membrane wall is suitable to resist to the downhole hydrocarbon well pressure and wherein said downhole ultrasonic transducers are angularly distributed as an array around a cylindrical housing, each downhole ultrasonic transducer defining a measuring angular sector around the probe, each downhole ultrasonic transducer being connected to a tool control circuit, the tool housing constituting a ground for the tool control circuit.

* * * * *